United States Patent [19]

Hengeveld et al.

[11] Patent Number: 5,333,154
[45] Date of Patent: * Jul. 26, 1994

[54] DIGITAL DATA GENERATION SYSTEM INCLUDING PROGRAMMABLE DOMINANCE LATCH

[75] Inventors: John A. Hengeveld, Aloha; Jonathan C. Lueker, Portland; Bradford H. Needham, Hillsboro; Burt Price, Portland; James Schlegel; Mehrab Sedeh, both of Beaverton, all of Oreg.

[73] Assignee: Tektronix, Inc., Wilsonville, Oreg.

[*] Notice: The portion of the term of this patent subsequent to May 4, 2010 has been disclaimed.

[21] Appl. No.: 844,362

[22] Filed: Mar. 2, 1992

[51] Int. Cl.$^5$ .............................................. H04L 7/00
[52] U.S. Cl. ..................................... 375/106; 307/269; 307/289
[58] Field of Search ............... 307/269, 265, 289, 266; 364/718, 721; 341/173, 177; 375/106

[56] References Cited

U.S. PATENT DOCUMENTS 3,883,756  5/1975  Dragon .............................. 307/273
4,680,479  7/1987  Alonso .............................. 307/265
5,208,598  5/1993  Lueker et al. .................... 364/719
5,233,589  8/1993  Saito et al. ....................... 369/48

Primary Examiner—Stephen Chin
Assistant Examiner—T. Ghebretinsae
Attorney, Agent, or Firm—William A. Birdwell; Boulden G. Griffith

[57] ABSTRACT

A digital data generation system including a programmable dominance RS flip-flop has a random access memory that stores a user selected sequence of test data. A pattern formatting logic circuit receives the test data and produces, for each data period, a coarsely timed candidate pulse for identifying the leading edge of an output data pulse and a coarsely timed candidate pulse for identifying the trailing edge of the output data pulse. A precision delay circuit finely tunes the timing of the candidate pulses. The finely tuned pulses are applied to an RS flip-flop circuit which can be programmed for set or reset dominance, thereby preventing an indeterminate state when a logic "1" is applied to both the set and the reset input. In the system, the flip-flop is programmed so that the most recent of the lead pulse or the trail pulse prevails.

14 Claims, 13 Drawing Sheets

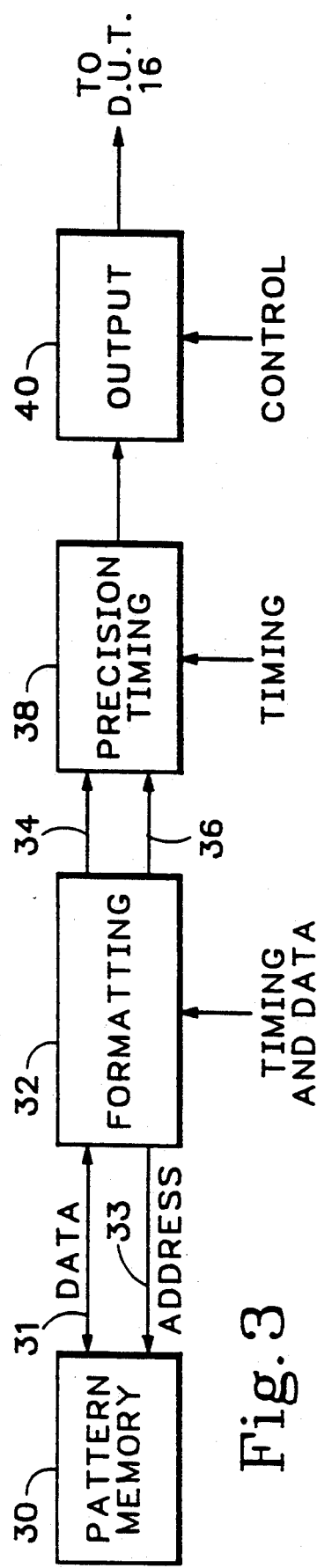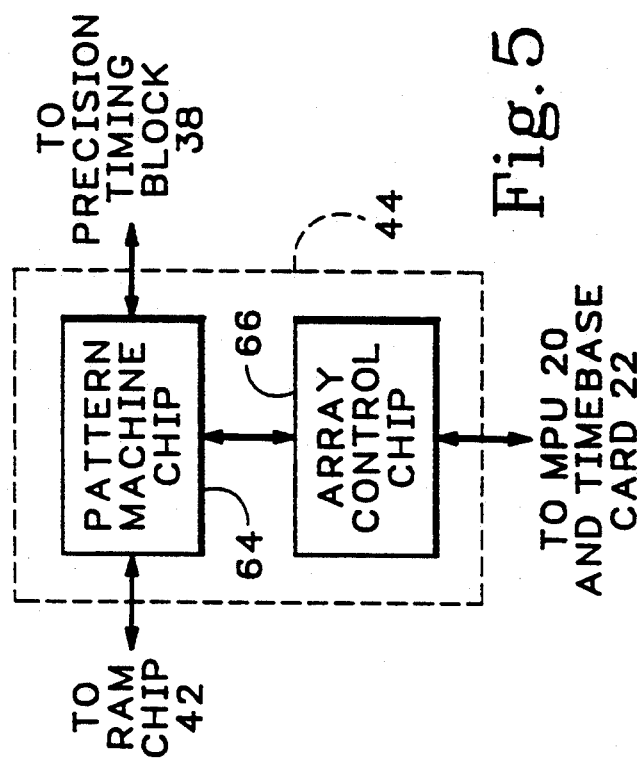

DIGITAL DATA GENERATION SYSTEM INCLUDING PROGRAMMABLE DOMINANCE LATCH

BACKGROUND OF THE INVENTION

This invention relates to digital data generation test systems, particularly systems for characterizing devices under test by their ability to respond to data signals of variable content, rather than merely to periodic pulses.

Conventional data generation test systems combine in separate stages a data source, a pulse generator and a switch matrix. The data source produces a stream of user-selectable data. The pulse generator produces, in response to the data generator, a pulse having selectable characteristics. The pulse generator typically is comprised of two monostable multivibrators connected in series: the first to generate the delay characterizing the leading edge of each data pulse in the data signal, the second to generate the width of each data pulse. An example of such a pulse generator is the Hewlett-Packard HP-8131A which generator is described in the August 1990 Hewlett-Packard Journal. The switch matrix directs the data pulse produced by the pulse generator to a particular pin of the device under test.

The architecture of conventional data generation test systems has a significant number of limitations. First, conventional architecture relies in part on analog circuitry, e.g., monostable multivibrators, which requires the user to design, assemble, program, debug, characterize, and eliminate skew from the output of the data generation test system before a device can be tested. Second, conventional data generation test systems are subject to retrigger limitations. Once the data signal has made a transition from a logic level "1" to a logic level "0", monostable multivibrators used in such conventional systems require some minimum recovery time before they can retrigger a transition to a logic level "1". As a practical matter, this limits the possible duty factor to substantially less than 100%. Third, conventional data generation test systems determine the trailing edge timing of each data pulse derivatively from the delay of the rising edge and the width of the data pulse, which limits their flexibility in establishing the timing of the trailing of the data pulse. Fourth, data generation test systems using monostable multivibrators generally do not allow a user to insert a controllable one-time delay at the outset of the data signal. Fifth, such data generation test systems provide only limited options for formatting the data signal. Sixth, conventional data generation test systems generally provide only limited modes for generating data signals. Seventh, such data generation test systems generally must be calibrated manually. The user makes calibration adjustments based on external measurements, particularly of the pulse generator stage, to maintain the accuracy of data signal timing.

In addition, even where digital logic devices are used to produce the data pulse, not all of the pulse period can be employed. In the production of a data pulse of arbitrary width using digital logic devices, the conventional approach is to employ a set-reset flip-flop (an "RS flip-flop") so that a first input pulse applied to the set input of the flip-flop starts the output pulse and a second input pulse applied to the reset input of the flip-flop terminates the output pulse. The time between the first input pulse and the second input pulse determines the width of the output pulse. However, the minimum pulse width that can be produced from such a circuit is one whose width is equal to the clock pulse width, since the output of an RS flip-flop is undefined when both the set and the reset inputs are asserted. The maximum pulse width is equal to the difference between the clock pulse period and the clock pulse width, for the same reason. Where it is desirable to produce a pulse having a duty cycle of anywhere from 0 to 100% of the clock period, the conventional approach is inadequate, so a new approach is needed.

Accordingly, there is a need for an improved data generation test system for characterizing devices under test by their ability to respond to the data signals output by one or more data generation systems.

SUMMARY OF THE INVENTION

The present invention fulfills the aforementioned need by providing a data generation system that has a fully integrated digital architecture, that is ideally, i.e., immediately, retriggerable, that allows the user to control independently both leading and trailing edges for duty factors from 0 to over 100%, that allows the user to insert delays at the outset of the data signal without undesirable consequences on the leading and trailing edge timing of data pulses in the data signal, that allows the user a plurality of data formats and signal generation modes, that provides user programmable control over the format of the data signal and that self-calibrates automatically. In addition, the invention provides a novel programmable dominance RS flip-flop circuit which permits the generation of a data pulse having a duty factor from 0 to over 100%.

In the invention, a memory device stores user-selectable data comprising logic level "1"s and "0"s corresponding to the data pulses of the data signal to be produced by the data generation system for application to the device under test ("DUT"). A formatting block reads that data in parallel, translating it into two serial streams of coarsely-timed edge placement data—one stream corresponding to the leading edge of data pulses and the other stream corresponding to the trailing edge of such pulses. That translation is performed according to a combination of (i) the timing instructions programmed by the user, (ii) the history of the edge placement data, and (iii) the format of the data signal programmed by the user.

The formatting block establishes the user programmed data signal output period with reference to a variable master clock applied to the data generation test system. When the user programmed period of the data signal corresponds to a frequency within the range of the master clock, the formatting block directs the master clock to operate at a frequency equal to the inverse of the user programmed period. In that case, the data signal has a period equal to the master clock period. When the user programmed period corresponds to a frequency below the range of the master clock, the formatting block directs the master clock to operate at a frequency equal to the quotient of the user programmed period divided by a scaling value calculated by the formatting block. The data signal output by the data generation system has a period constructed as a concatenation of master clock periods, the number of which concatenated periods equals the calculated scaling value.

The two serial streams produced by the formatting block are routed to a precision timing block within which user programmed timing instructions are applied to each stream of edge placement data to delay independently the leading edge and the trailing edge of each data pulse in up to three levels of incrementally fine delay. The precision timing block, using those two streams, constructs each data pulse of the data signal.

In constructing each data pulse of the data stream, the precision timing block overcomes limitations inherent with conventional pulse circuits respecting production of a pulse of arbitrary width in digital circuit. That is, the inability of a conventional pulse circuit to produce a pulse having a full range of duty factor from 0 to 100% is overcome in this system by providing the aforementioned programmable dominance RS flip-flop circuit, which can also behave like a D-type latch. That is, as an RS flip-flop, the circuit can be controlled so that either the set input or the reset input determines the output when both are at a logic level "1". This is accomplished by the use of a D-type latch having a multiplexer connected to its D input and a first "OR" gate connected to its enable input. The multiplexer selects between a set input and a reset input for application to the D input of the latch, signals applied to those inputs also being applied to inputs of the "OR" gate so as to enable the latch. When it is desirable to produce a low duty factor pulse, reset is made dominant. When it is desirable to produce a high duty factor pulse, set is made dominant. As a result, indeterminant states are eliminated.

The pulse production circuit is adapted to behave like an RS flip-flop in "return to zero" ("RZ") and "return to 1" ("R1") modes. However, it includes a mechanism for selectively causing the circuit to behave like a transparent latch in a "nonreturn to zero" ("NRZ") mode. This is accomplished by placing an "AND" gate at the set input of the "OR" gate, one input of the "AND" gate being the set input and another, inverting input of the "AND" gate providing a "nonreturn to zero" ("NRZ") input. When the NRZ input is at logic level "1", the enable input to the D-type latch stays at logic level "1" so that the logic level at the D input is passed through to the output of the latch. Also, a second "OR" gate is placed at the other input of the first "OR" gate that is connected to the enable input. One input of the second "OR" gate receives the reset signal, while the other receives a direct reset signal.

The data pulses generated by the precision timing block are routed to an output block wherein voltage levels are set according to user programmed instructions for application of the data signal to the DUT.

The output block is also connected to an analog to digital converter which is used not only to calibrate output voltage levels, but also to calibrate the various delay mechanisms by monitoring small changes in the data signal's duty factor.

The digital data generation test system provides the user with control over the insertion of delays at the outset of the data signal, over the format and over the mode of data signal generation.

Accordingly, a principal object of the present invention is to provide a novel and improved data generation test system for characterizing devices under test by their ability to respond to data signals.

Another object of the present invention is to provide a data generation test system that has a fully digital architecture allowing the user to program data rates, data voltage levels and other characterization parameters.

A further object of the present invention is to provide a data generation test system that is ideally retriggerable.

Yet another object of the present invention is to provide a data generation test system that allows the user to control timing of data pulses through independent control over leading and trailing edges, thereby providing duty factors from 0 to over 100%.

Yet a further object of the present invention is to provide a data generation test system that allows the user to insert controllable delays at the outset of the data signal.

Another object of the present invention is to provide a data generation test system that allows the user to control the format of the data signal and to select from among a plurality of modes for generating data signals.

A further object of the present invention is to provide a data generation test system that self-calibrates automatically.

It is yet another object of the present invention to provide an RS flip-flop circuit that can be programmed so as to cause either a set input or a reset input to dominate when both the set and reset inputs are present.

It is a yet further object of the present invention to provide an output pulse generation circuit which can be caused to behave either like an RS flip-flop in RZ or R1 modes, or like a D-type latch in an NRZ mode.

The foregoing and other objects, features, and advantages of the invention will be more readily understood upon consideration of the following detailed description of the invention, taken in conjunction with the accompanying drawings.

BRIEF DESCRIPTION OF THE DRAWINGS

FIG. 3 shows a general block diagram of an embodiment of a data generation test unit according to the present invention.

FIG. 5 shows a block diagram of the pattern machine block of FIG. 4.

DETAILED DESCRIPTION OF THE INVENTION

Figure 1:
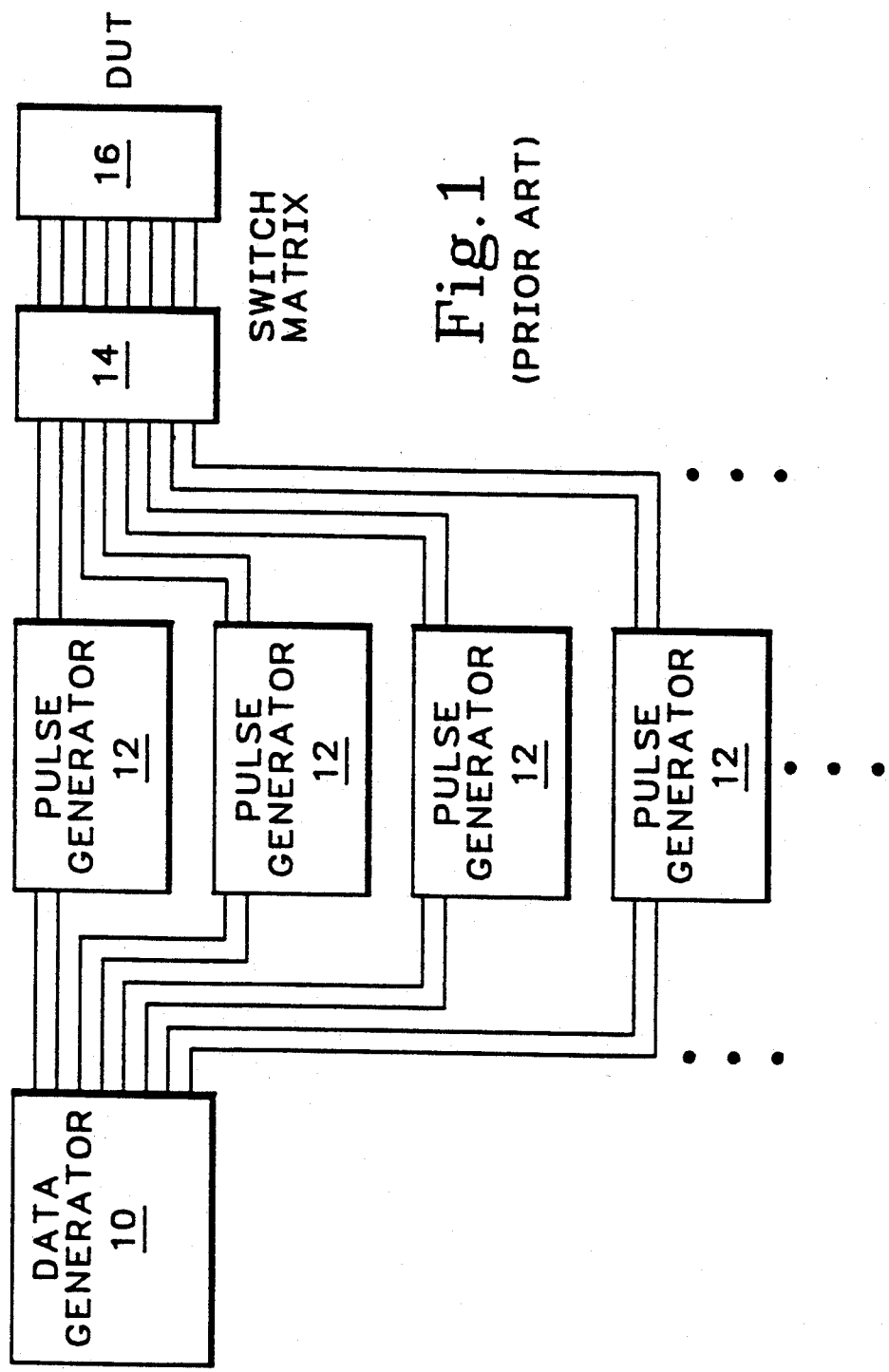
FIG. 1 shows a block diagram of a general embodiment of a prior art four channel data generation test system.

Referring to FIG. 1, a conventional data generation test system is comprised of a data generator 10, one or more pulse generators 12, and a switch matrix 14 connected in parallel to a device under test ("DUT") 16. The data generator 10 generates digital words of data in parallel channels, with timing for each channel provided by one of the discrete pulse generators 12. The switch matrix 14 directs the data signal to a particular pin of the DUT 16. Typically, the pulse generators 12 establish the timing of each data pulse in the data signal by configuring two, series-coupled monostable multivibrators—the first to control the delay characterizing the leading edge of each data pulse and the second to control the width of each data pulse. Because the width of each data pulse is controllable, the width can be set to collapse the trailing edge of the data pulse onto the leading edge. However, control over the width of the data pulse provides only limited, derivative control over the timing of the trailing edge of each data pulse. Moreover, pulse generators 12, which use monostable multivibrators, are subject to retrigger limitations that effect an architectural limitation on the duty factor of the data signal: once the data signal has changed from a logic level "1" to a logic level "0", the monostable multivibrators require some minimum recovery time before they can retrigger a change to a logic level "1".

Figure 2:
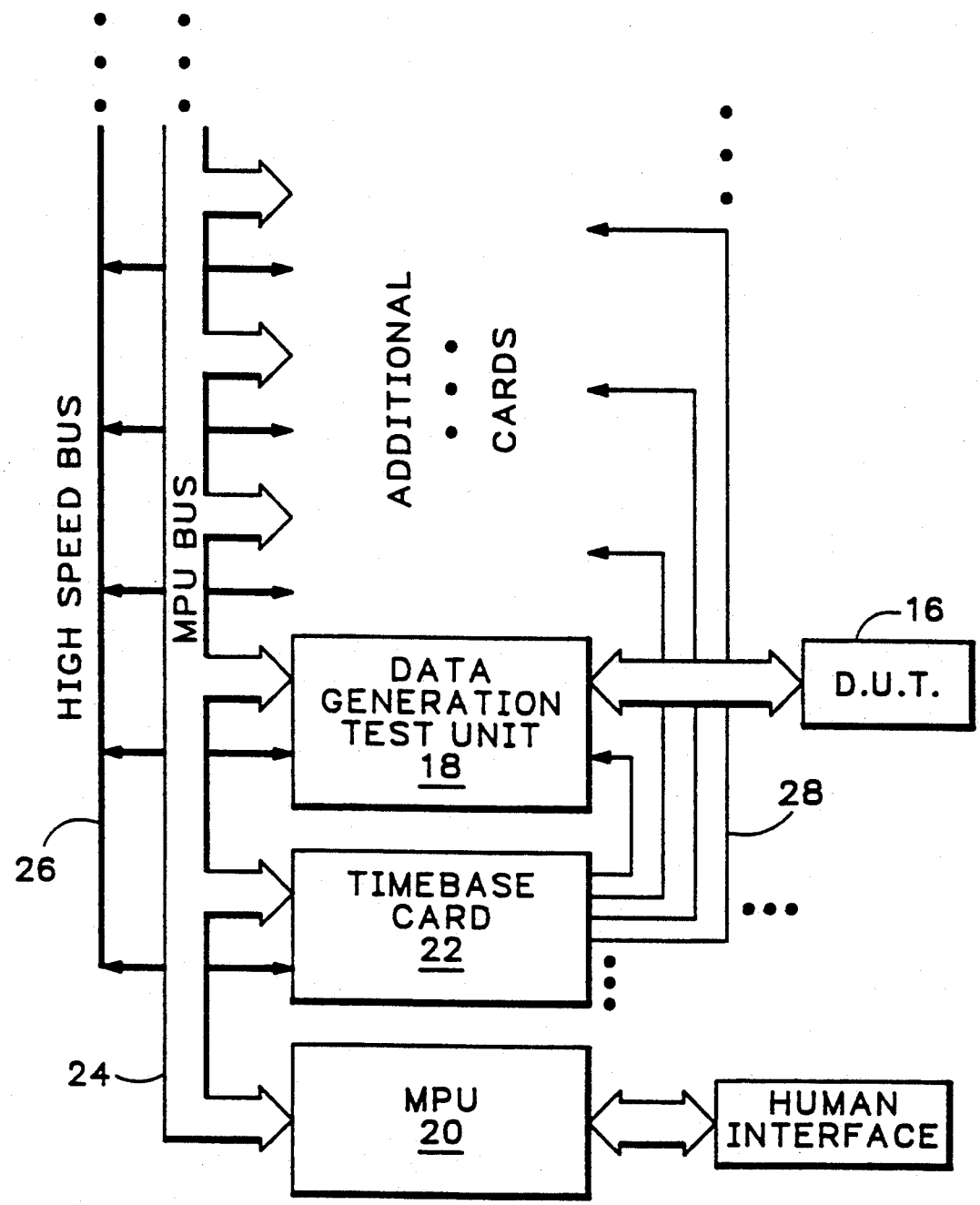
FIG. 2 shows a system level block diagram of a data generation test system according to the present invention, having a data generation test unit, an external microprocessor and a timebase generator, all interconnected.

FIG. 2 shows a system level block diagram of the data generation test system which overcomes the above-identified limitations of conventional data generation circuits. The data generation test system 18 is contained on a card interfaced to an external microprocessor ("MPU") 20 and an external timebase card 22. The external microprocessor 20 communicates with one or more data generation test units 18 and with the timebase card 22 over an MPU bus 24. A high speed bus 26 permits rapid communication between the data generation test units 18 and the timebase card 22. Shielded twisted pairs 28 carry a high speed clock generated by the timebase card 22 to the data generation test units 18.

Each card containing a data generation test system preferably is constructed to contain a plurality of separate data generation test units 18 in order to provide multiple channels of data signals for application to the DUT 16. Each channel uses the high speed clock of the timebase card 22 as a master clock, as will be explained further below.

The timebase card 22, in conjunction with each data generation test unit 18, provides a plurality of operating modes, including burst mode, auto-burst mode, triggered-auto mode and auto mode. In burst mode, the time base card 22 is idle until detecting an external triggering event whereupon the time base card 22 then generates a number of master clock cycles sufficient to cause the data generation test unit 18 to output a data signal composed of a user programmed number of data bits. The fixed startup delay of approximately 100 nanoseconds is programmed into the data generation test unit 18. As will be explained further below, in the preferred embodiment of the invention the user can select and store up to 64 kilobits of data, all of which can be output in burst mode. It is to be understood that the invention can be constructed to allow selection and storage of any number of data bits without departing from the principles of the invention.

In auto-burst mode, the data generation test unit 18 produces an output similar to that of burst mode, except that the timebase card 22 internally generates trigger events providing a fixed delay between each burst. Preferably, the fixed delay is approximately 15 microseconds.

In auto mode, the time base card 22 generates a continuous stream of master clock cycles without waiting for a triggering event. Driven by such clock cycles, the data generation test unit 18 generates a continuous data signal composed, in the first pass through the user's data, of data pulses corresponding to the data bits stored in the pattern memory 30 from a start bit to an end bit as such bits are flagged by the user. In subsequent passes through the user's data, the data signal is composed of data pulses corresponding to the data bits flagged by the user from a loop bit to the end bit, as flagged by the user. The timebase card 22 and the data generation test system 18 continuously so operate until interrupted by the user, either manually or by a programmed command.

In triggered-auto mode, the data generation test unit 18 produces an output similar to that of auto mode, except that the timebase card 22 waits for an external triggering event like burst mode before producing the master clocks.

The timebase card 22 and the data generation card 18 are configured by the microprocessor 20 via the MPU bus 24 in accordance with user programming, such configuration occurring in advance of data signal generation. Once the timebase card 22 and the data generation card 18 have been configured, they operate as state machines independent of the microprocessor 20 to produce data signals, communicating with each other over the high speed bus 26 as necessary to effect the user program.

FIG. 3 shows a block diagram of the data generation test unit 18 of FIG. 2. In FIG. 3, a pattern memory block 30 stores user-selectable data comprising logic level "1"s and "0"s that correspond to the data pulses of the data signal output by the data generation unit 18 for application to the device under test 16. A formatting block 32 loads that data into the pattern memory block 30 over a bidirectional data bus 31; the data is supplied to the formatting block 32, together with addressing information, by the microprocessor 20 via the MPU bus 24, as shown in FIG. 2.

In operation, the formatting block 32 reads data from the pattern memory block 30 in parallel over the bidirectional data bus 31, addressing such data over address lines 33. The formatting block 32 translates each data bit so read into two serial streams of coarsely-timed edge placement data 34,36—one stream 34 being edge placement data corresponding to the leading edge of data pulses and the other stream 36 being edge placement data corresponding to the trailing edge of data pulses. The formatting block 32 performs that translation according to a combination of (i) the timing instructions programmed by the user, (ii) the history of the edge placement data, and (iii) the format of the data signal programmed by the user.

The two streams of edge placement data 34,36 produced by the formatting block 32 are routed to a precision timing block 38. The precision timing block 38 applies user programmed timing instructions independently to each stream 34,36 to effect fine timing delays in the leading edge and the trailing edge of each data pulse in up to three levels of incrementally fine delay. In addition to introducing such delays, the precision timing block 38, using the two streams 34,36, constructs each data pulse of the data signal and provides formatting. The output data pulse is constructed by applying a finely-timed leading edge placement data pulse to the set input of programmable dominance RS flip-flop to initiate the output pulse, and a finely-timed trailing edge placement data pulse to the reset input of the flip-flop to terminate the output pulse. The structure and operation of the flip-flop are explained in detail below.

The data pulses so constructed by the precision timing block 38 are routed to the output block 40, wherein voltage levels are set according to user programmed instructions and wherefrom the data signal is applied to the DUT 16. The output block 40 also comprises circuitry that is used to calibrate output levels and to calibrate the various delay mechanisms of the precision timing block 38 by monitoring small changes in duty factor of the data signal.

In addition to translating the data of the pattern memory block 30 into edge placement data, the formatting block 32 establishes the user programmed period in terms of the master clock of the timebase card 22. The master clock, which can be constructed in any convenient way, as is commonly understood in the art, preferably has a range of operation that, in frequency, meets at least the highest frequency at which the device under test 16 will be characterized. In the preferred embodiment, the master clock has a range from 325 MHz to 650 MHz, in discrete steps. When the user programmed period of the data signal corresponds to a frequency within the range of the master clock, the formatting block 32 directs the master clock to operate at a frequency equal to the inverse of the user programmed period. In that case, the data signal output by the data generation test system 18 has a period equal to the master clock period.

When the user programmed period corresponds to a frequency below the range of the master clock, the formatting block 32 directs the master clock to operate at a frequency equal to the product of the frequency to which the user programmed period corresponds and a scaling factor calculated by the formatting block 32. In other words, the frequency of the master clock is adjusted to operate at some value within the master clock's range that, when divided by the scaling factor, yields the inverse of the user programmed period to an acceptable accuracy. In that case, the formatting block 32 calculates a unique combination of master clock frequency and scaling factor to construct the user programmed period as a concatenation of multiple master clock periods.

The formatting block 32 configures the data generation test system 18 to produce the user programmed period according to the general formula: $T(u) = T(m) * 2^n$ where $T(u)$ is the user programmed period, $T(m)$ is the master clock period, $2^n$ is the scaling factor, and $T(m)$ and $n$ are mutually dependent. The microprocessor 20 calculates $n$ in floating point and converts the result to the nearest integer, which integer is used to select the discrete step within the master clock frequency range that yields $T(u)$ with the prescribed accuracy. The $2^n$ scaling factor is then programmed into the formatting block 32 by the microprocessor 20. In sum, user programmed periods are achieved by setting $T(m)$ to some discrete step within its range and concatenating $2^n$ of such master clock periods.

As a consequence of constructing user programmed periods from concatenated multiples of the master clock period, the formatting block 32 also contributes to the timing of the data pulses in the data signal. As will be explained further below, the formatting block 32 achieves a coarse level of timing by generating leading and trailing edge placement data streams 34,36 that result in the location of each data pulse in the user programmed period with an accuracy of within one master clock period.

The data output signal from the output block 40 corresponds to the user-selected data loaded into the pattern memory block 30, with timing, formatting and voltage levels fixed in accordance with user programming. In the preferred embodiment, formatting options include pulse, nonreturn to zero ("NRZ"), return to zero ("RZ"), return to one ("R1") and DC Levels. Data pulse timing respecting delay and width is based on independent control of leading and trailing edge delays. Voltage levels are independently controlled by user programing. Moreover, because the data generation test system 18 has a fully digital architecture, the retrigger and delay limitations of systems relying on monostable multivibrators are absent and calibration is automatic.

Figure 4A:
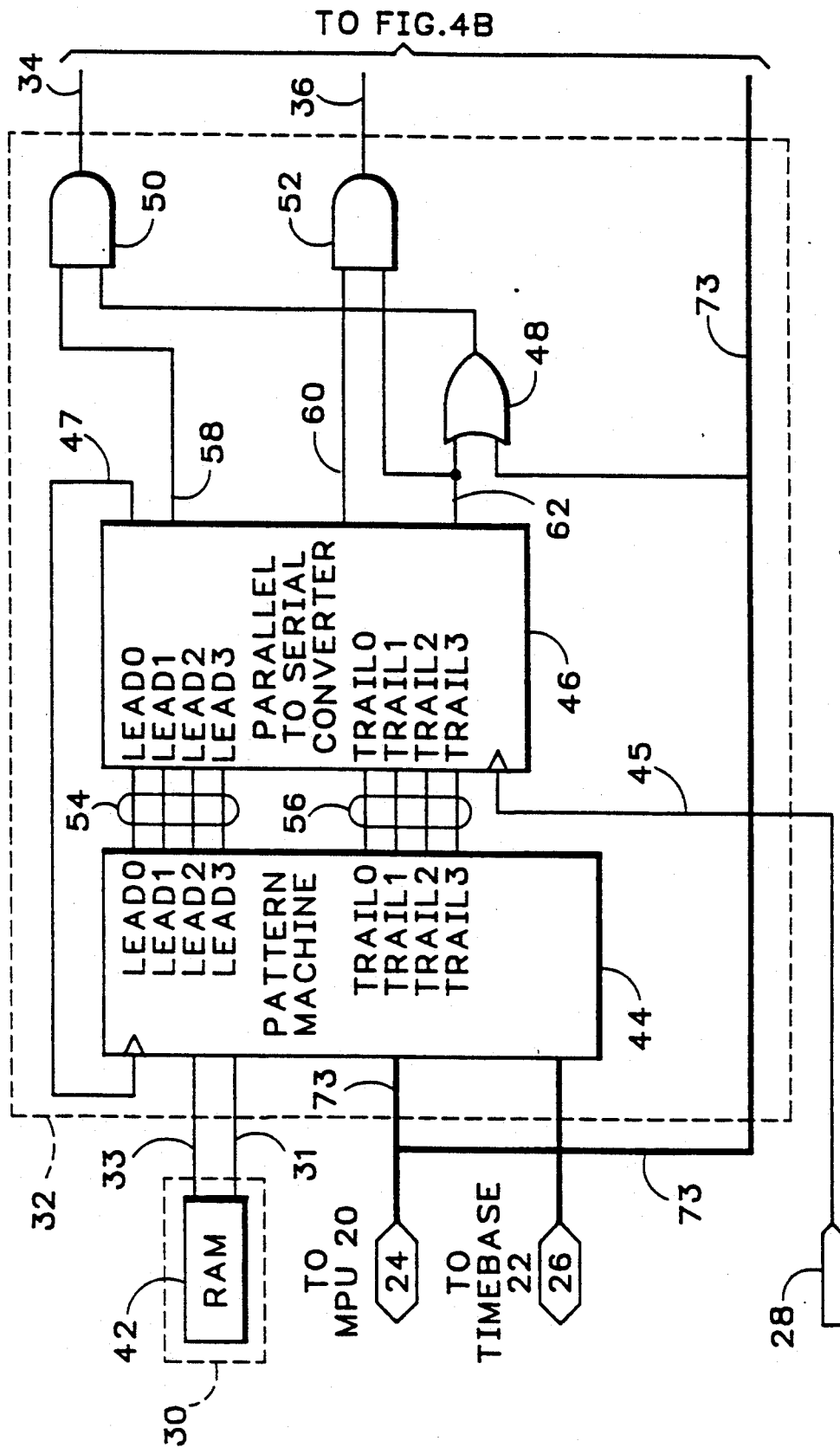
FIGS. 4A and 4B show a logic level block diagram of a general embodiment according to the present invention.
Figure 4B:
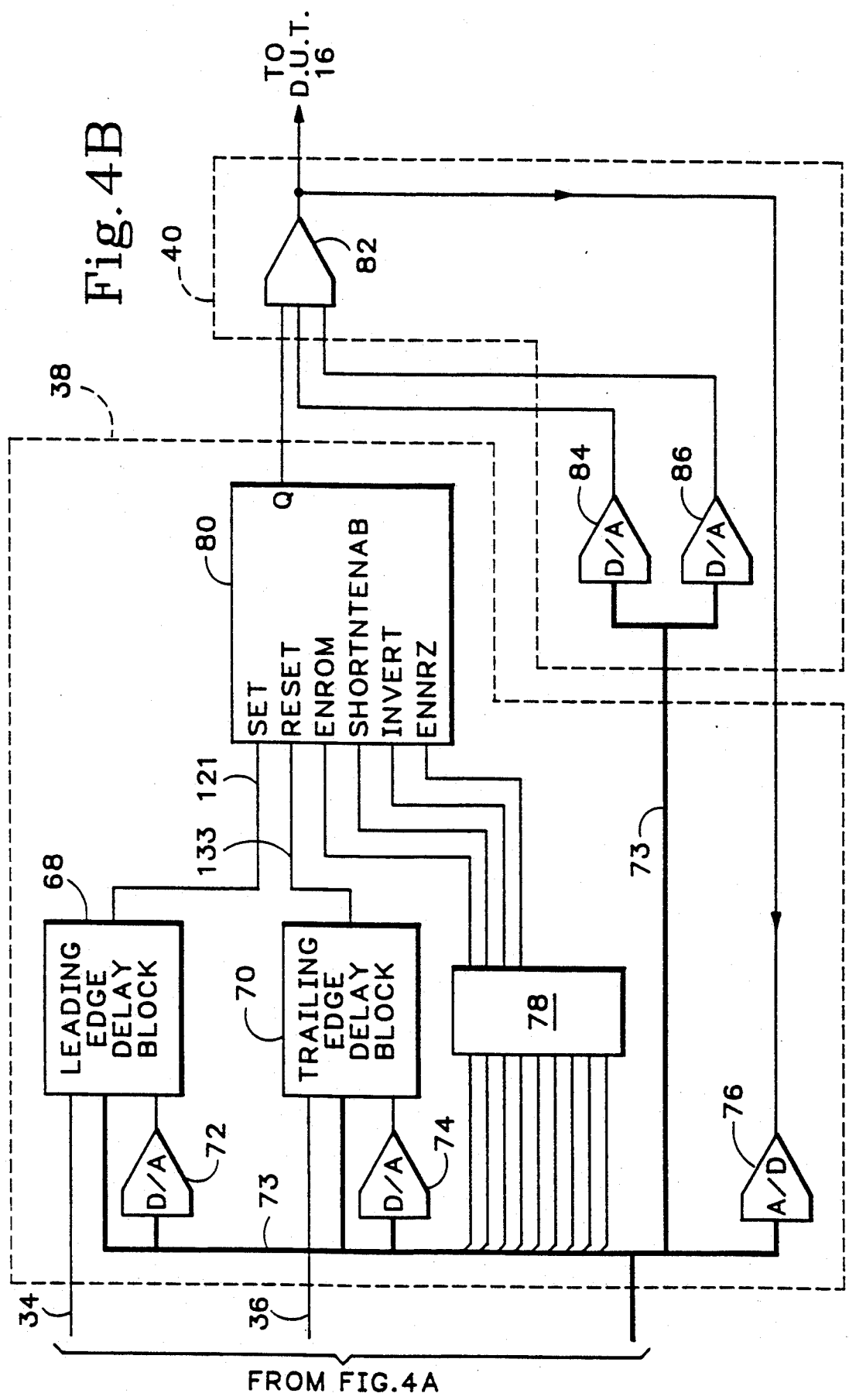

FIGS. 4A and 4B show a logic block diagram of a preferred embodiment of the present invention. The pattern memory block 30 is comprised of a random access memory ("RAM") chip 42. Preferably, the RAM chip 42 is an 8Kx8 CMOS Static RAM, with at most 10 nanoseconds access time from address stable and with a minimum 3 nanosecond hold time from address change. Each of the 64 kilobits stored in the RAM chip 42 corresponds to one user programmable period in the data signal.

The formatting block 32 comprises a pattern machine block 44, a parallel to serial converter chip 46, a logic "OR" gate 48, a logic "AND" gate 50 and a logic "AND" gate 52. The pattern machine block 44 loads data into the RAM chip 42, the data being supplied to the pattern machine block 44 together with addressing information over the MPU bus 24. The pattern machine block 44 also reads data bytewise from the RAM chip 42, translating it into nibbles of coarsely-timed edge placement data 54,56, that is, edge placement data nibbles 54 for the leading edge of data pulses and edge placement data nibbles 56 for the trailing edge of data pulses.

The parallel to serial converter chip 46 may be a commercially available chip. Preferably, the parallel to serial converter chip 46 is a Sony CXB1130QY Dual 4-Bit Multiplexer: an ultra high speed ECL multiplexer which functions as a dual 4-bit parallel to serial converter. The converter chip 46 is clocked by the master clock 45 carried over the shielded twisted pair 28. From the 50% duty factor master clock, the converter chip 46 produces a slave clock 47 with a 25% duty factor and a frequency of 25% of the master clock 45.

The slave clock 47 is routed to the pattern machine block 44 to signal the pattern machine block 44 that the converter chip 46 will load edge placement data nibbles 54,56. The converter chip 46 loads, in parallel, each of the leading edge placement data nibble 54 and the trailing edge placement data nibble 56 from the pattern machine block 44 every fourth master clock 45 cycle.

The converter chip 46 signals each such load operation to the pattern machine block 44 by asserting the slave clock 47 for one master clock 45 cycle and then clears the slave clock 47 after completing the loading operation. The converter chip 46, on each master clock 45 cycle, serially outputs one bit of each such nibble 54,56, respectively, in an ungated leading edge placement data stream 58 and an ungated trailing edge placement data stream 60.

The converter chip 46 also outputs the master clock 45 as a gating clock 62 that is delayed by an amount equivalent to the propagation delay between the master clock 45 as input to the converter chip 46 and the output of the ungated edge placement data streams 58,60. Typically, the gating clock 62 is delayed an additional 200 picoseconds by the layout of formatting block 32 on the card.

From the converter chip 46, the gating clock 62 is routed to both the logic "AND" gates 50,52 where it gates, respectively, the ungated leading edge data stream 58 and the ungated trailing edge data stream 60 to produce the edge placement data streams 34,36 that are applied to the precision timing block 38. Such gating shortens the duration of any pulse in the edge placement data streams 34,36 to accommodate timing limitations imposed by the precision timing block 38. System jitter is reduced by aligning the data streams 34,36 with the master clock 45 in AND gates 50,52.

In the case of operation in NRZ format, an NRZ control signal is routed to logic "OR" gate 48 where it gates the gating clock 62, thereby asserting logic "AND" gate 50. As a consequence, the ungated leading edge placement data stream 58 is not gated by the gating clock 62, thereby causing any pulse in the leading edge placement data stream 34 to have a hold time that is not shortened. This result is necessary to satisfy timing requirements imposed by the precision timing block 38 because in NRZ mode the programmable dominance RS flip-flop is operated as a D-type latch.

Referring to FIG. 5, the pattern machine block 44 is comprised of two gate arrays: the pattern machine chip 64 and the array control chip 66. The array control chip 66 is a commercially-available field programmable gate array that provides logic configurations based on programing performed by the applicant in manufacture of the data generation test system 18. Preferably, the array control chip 66 is a Xilinx XC3000 Family Field Programmable Gate Array.

The array control chip 66 receives instructions from the microprocessor 20, which instructions correspond to the data signal programming of the user. The array control chip 66 functions, in general terms, as a channel-resident controller circuit interfacing the MPU data bus 24 and the pattern machine chip 64, for example, controlling the pattern machine chip 64 in order to speed reinitialization between bursts of data.

The pattern machine chip 64 is an ECL gate array which, in general terms, functions as a controller of the RAM chip 42 (reading and writing data to the RAM chip 42 as directed by the microprocessor 20) and as a converter of data from the RAM chip 42 into edge placement data.

The pattern machine chip 64 internally generates candidate pulses corresponding to the leading edge of potential data pulses and candidate pulses corresponding to the trailing edges of potential data pulses. As candidates, these pulses are output by the pattern machine chip 64 according to the data bits from the RAM chip 42 corresponding to user programmed periods, the timing and formatting programmed by the user and the history of the edge placement data. In general terms, if the data bit for a user programmed period is a logic level "1", the pattern machine chip 64 will use the candidate pulses to output (i) a leading edge placement data pulse coarsely timed within the user programmed period according to the leading edge delay programmed by the user, and (ii) a trailing edge placement data pulse coarsely timed within the user programmed period, provided the user programmed trailing edge delay of the data pulse, together with the leading edge delay, amounts in time to less than the user programmed period.

For each of the leading and trailing edge placement data streams 34,36, the pattern machine chip 64 outputs at most one pulse in each user programmed period. Each such pulse has its rising edge on the boundary between two master clock 45 periods and remains high over the duration of that master clock 45 period. Because a user programmed period is generally composed of a concatenated multiple of master clock 45 periods and only one master clock 45 period is consumed by the pulse, the pattern machine chip 64 interleaves logic level "0"'s into the edge placement data stream for all other master clock periods of the user programmed period. As a consequence of this edge placement function, the pattern machine chip 64 achieves coarse timing with an accuracy of within one master clock 45 period.

In operation with the RAM chip 42 and the converter chip 46, the pattern machine block 44 generates a byte of edge placement data upon each falling edge of the slave clock 47. Of each such data byte, one nibble is leading edge placement data and the other nibble is trailing edge placement data. Each such nibble comprises the next four bits of data to be loaded into the converter chip 46 for output by that chip on four consecutive master clock cycles. Each bit in each such nibble is one of $2^n$ such bits output by the converter chip 46 for each data bit in the RAM chip 42—each user programmed period corresponding to one such data bit and being built from the concatenation of $2^n$ master clock 45 cycles, as explained above.

The pattern machine block 44 generates a new address in, and reads data from, the RAM chip 42 each 2,4,8 ... 256 slave cycles, depending on the number of master clock 45 cycles concatenated to build the user programmable period. For example, in fastest operation, the user programmable period is one master clock 45 period (i.e., n equals zero for the $2^n$ scaling factor) and, therefore, one data bit in the RAM chip 42 is output per master clock 45 cycle. In that case, the pattern machine block 44 reads data in bytes from the RAM chip 42, but outputs edge placement data in nibbles; accordingly, the pattern machine block 44 reads data only once each 2 slave clock 47 cycles or, equivalently, once every eight master clock 45 cycles. At other operating frequencies, the user programmable period will be some power-of-two multiple of master clock 45 cycles, thereby requiring the pattern machine block 44 to read data on a readily ascertainable power-of-two multiples of slave clock 47 cycles.

The edge placement data streams 34,36 generated by the formatting block are routed from the logic "AND" gates 50,52 to the precision timing block 38. Edge placement to a precise accuracy is accomplished in the precision timing block 38. The precision timing block comprises leading edge delay block 68, trailing edge delay block 70, lead digital-to-analog converter 72, trail digital-to-analog converter 74, one analog-to-digital converter 76, an 8-bit TTL register 78, and programmable dominance RS flip-flop latch 80.

Each delay block 68,70 comprises a single delay line and a programmable delay chip. Preferably, the programmable delay chip is a Motorola 100E196 Programmable Delay Chip providing highly accurate edge placement at two levels of resolution. The delay line provides the coarsest resolution among the precision delays, and its delay is referred to herein as a "shim". The Motorola chip provides delays of intermediate resolution, with such delays referred to herein as "slivers". It also provides delays of the finest resolution, with such delays referred to herein as "verniers".

In operation, as explained above, the formatting block 32 provides edge placement within an accuracy of one master clock 45 cycle. The delay blocks 68,70 are constructed to provide additional delays using three sources of incremental resolution that, in various combinations of the three, provide delays ranging from zero to one master clock cycle.

In the preferred embodiment, the master clock 45 cycle ranges in period from 1.54 nanoseconds at a frequency of 650 MHz to 3.08 nanoseconds at a frequency of 325 MHz. With a design margin of 200 picoseconds, the coarsest edge placement accuracy is approximately 3.30 nanoseconds. In order to achieve a delay range from 0 to 3.30 nanoseconds in each delay block 68,70 with finest resolution of at least 5 picoseconds, each delay line provides a shim of 1.8 nanoseconds, each Motorola chip provides slivers of 20 picoseconds and also provides verniers of 0.1 picoseconds. The coarse generation part of the Motorola chip operates at the chip's nominal delay, as specified by Motorola. The fine generation part of the Motorola chip is tuned to provide the vernier delay, in accordance with the chip's specifications, by application of an analog voltage generated by the corresponding digital-to-analog converter 72,74. The converters 72,74 receive the digital data converted into the analog voltages over an internal data bus 73 that couples the converters 72,74 to the pattern machine block 44 and to the MPU bus 24.

To achieve accuracy in edge placement, the data test generation system must be calibrated. In the preferred embodiment, the precise delay time associated with each tap position of the Motorola 100E196 Programmable Delay Chips must be measured. The analog delay lines must also be evaluated to see how much delay they produce. In addition, the absolute delay through each channel in the data generation test system must be determined and stored.

To measure the shim delays associated with the delay line and the sliver and vernier delays associated with each Motorola 100E196 Programmable Delay Chip, the microprocessor 20 first instructs the pattern machine block 44 to produce a series of data pulses of incremental duty factors. Referring to FIG. 4, the on-board, low speed analog-to-digital converter 76 is used to measure the average output voltage of such data pulses, which will be very near the time-weighted average of the high levels and the low levels in such data pulses. These measurements, with the accuracy of the master clock 45, permit the relationship between pulse width variation and average output voltage to be determined.

Next, the pattern machine block 44 is instructed by the microprocessor 20 to produce a data pulse with 50% duty factor. By inserting coarse delays (equal to a master clock cycle), shim delays, sliver delays or vernier delays, and then measuring the average voltage after each such insertion and using the width-voltage relationship derived above, a precise value of each such delay can be established. The procedure can be used to measure the delay of each tap setting in the Motorola chips. As the microprocessor 20 performs these measurements, it stores all of the results in a table, so that appropriate values can be selected to carry into effect future operator commands.

The precise calibration of pulse width, or lead-to-trail skew, can be accomplished by setting up a pulse to have a 50% (requested) duty factor, measuring the average voltage output, inverting the pulse using the programmable dominance RS flip-flop, 80, as explained below, and measuring the average voltage output again. If the results of both measurements are the same, the duty factor is precisely 50%. If the results are not the same, the lead-to-trail skew can be calculated and its value stored as a calibration constant for that channel.

To align the absolute delays of the various channels in the data generation test system, a different procedure is used. The calibration input on the timebase card 22 has a means for determining whether the inputs it is monitoring are high or low at a very precisely controlled point in time. While this time is not adjustable and the inputs are only measured once per test, with this determination and the adjustability of each channel, it is possible to precisely time align each of the outputs with each other. The delay of each channel to be aligned is set to some low value so that a reference edge definitely precedes the calibration input sampling time. The delay is increased until the lowest delay value is found that is later than the sampling point. This delay is recorded as a calibration constant for that channel.

The programmable dominance RS flip-flop 80 receives the leading edge and trailing edge placement data pulses from delay blocks 68,70 respectively and produces an output pulse which is applied to the output block 40. The output block 40 comprises a pin driver 82 and two digital-to-analog converters 84,86. The pin driver 82 outputs the digital signal to the DUT 16. The digital-to-analog converters 84,86, as driven by data carried by the internal data bus 73, configure the pin driver's voltage level and current driving capabilities.

Figure 6A:
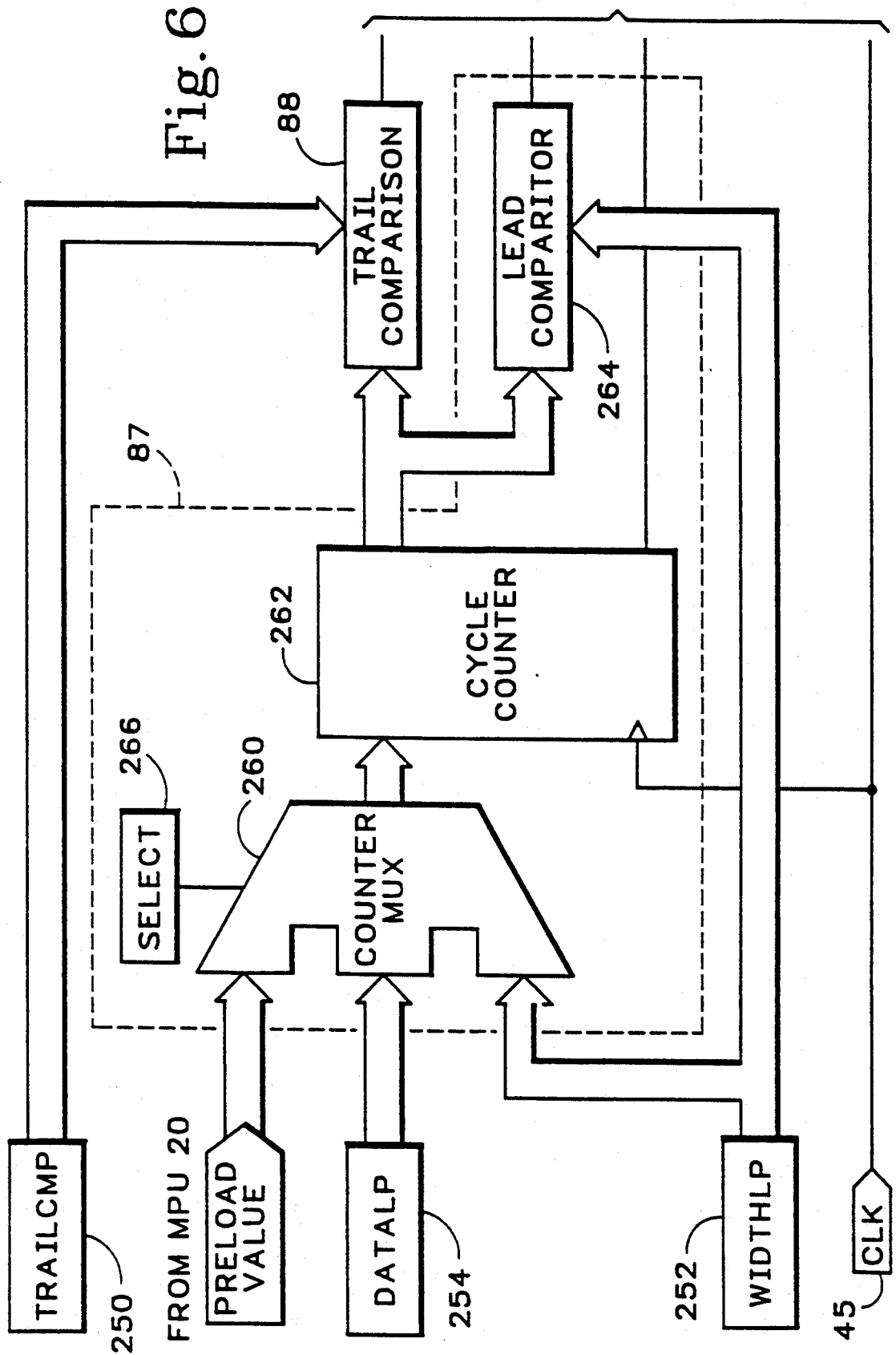
FIGS. 6A and 6B show a logic level block diagram of the pattern machine chip shown in FIG. 5.
Figure 6B:
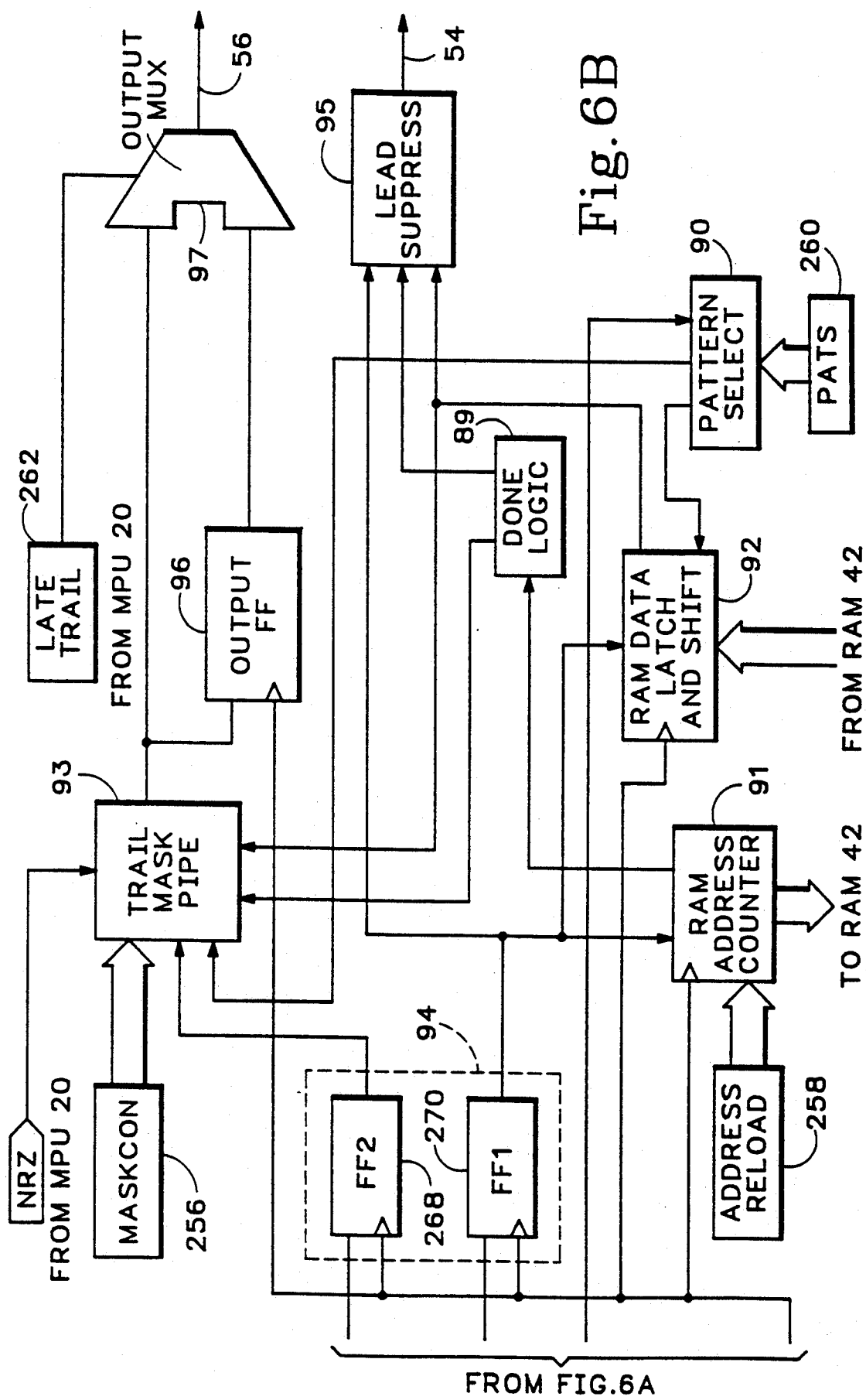

Turning now to FIGS. 6A and 6B the pattern machine chip 64 shown in FIG. 5 is preferably embodied in an integrated circuit, particularly a gate array circuit, operating at the rate of the master clock 45 and producing one bit of leading edge placement data and one bit of trailing edge placement data per master clock 45 cycle. In the preferred embodiment, the pattern machine chip 64 comprises a cycle counter block 87, a trail comparison block 88, a done logic block 89, a RAM address counter block 91, a RAM data latch and shift block 92, a trail mask pipe block 93, a top level block 94, and a lead suppress block 95.

The pattern machine chip 64 further comprises some output circuitry and some instruction input registers. The output circuitry comprises an output flip-flop 96 and an output multiplexer 97. The input registers comprise: a TRAILCMP register 250, a WIDTHLP register 252, a DATALP register 254, a MASKCON register 256, an address reload register 258, and a late trail register 262. Each such register is loaded with an instruction from the microprocessor 20 according to user programming.

The cycle counter block 87 receives a preload value from the microprocessor 20 which establishes the time following the beginning of a user programmed period at which a leading edge candidate pulse is produced. The value placed in the WIDTHLP register 252, together with the master clock 45 frequency, informs the pattern machine chip what the user programmed period is, in terms of a number of master clock cycles. The value placed in the TRAILCMP register 250 informs the pattern machine chip of the time of occurrence following a leading edge candidate pulse that a trailing edge candidate pulse is to be generated. A "1" or a "0" is placed in the late trail register 262 to establish whether or not the trailing edge candidate pulse is to be delayed one master clock cycle, as controlled by the output flip-flop 96 and the output multiplexer 97, to account for delay limitations in the precision timing block 38, as explained below.

The DATALP register 254 receives a value which governs those situations when a duty factor of greater than 100% is to be created. That value informs the pattern machine chip of how many master clock cycles are in an extended width pulse, i.e., what the duty factor is. The value in the MASKCON register 256 informs the pattern machine chip to suppress an invalid trailing edge candidate pulse so as to permit an extended width data pulse. The data from the RAM 42 is fetched into the pattern machine chip starting with the address placed in the address reload register 258.

The cycle counter block 87 comprises a counter multiplexer 260, a cycle counter 262, and lead comparator 264. The counter multiplexer 260 has a control input from select logic 266, data inputs from the DATALP register 254, the WIDTHLP register 252 and the microprocessor 20, and an output that is routed to the cycle counter 262. The cycle counter 262 is clocked by master clock 45. The count of the cycle counter 262 is routed as a first input to the lead comparator 264. The lead comparator 264 has a second input from the WIDTHLP register 252 and one output. The output of the lead comparator 264 is routed as a first input to the top level block 94.

The count of the cycle counter 262 is also routed as a first input to the trail comparison block 88. The trail comparison block 88 has a second input from the TRAILCMP register 250 and one output. The output of the trail comparison block 88 is routed as a second input to the top level block 94.

In operation, the cycle counter block 87 and the trail comparison block 88 produce leading edge and trailing edge candidate pulses, establish the user programmed period as multiples of the master clock 45 period, and disable production of trailing edge candidate pulses whenever user programming provides for data pulses of extended width (i.e., data pulses with duty factors exceeding 100%).

When producing leading edge candidate pulses that do not provide for data pulses of extended width, the select logic 266 selects for output from the multiplexer 260 the input routed from the WIDTHLP register 252. The WIDTHLP register 252 contains a value, calculated by the microprocessor 20, that when subtracted from the cycle counter's 262 terminal count, plus 1, equals the number of master clock 45 cycles concatenated to build the user programmed period. When that value is output from the multiplexer 260 and loaded into the cycle counter 262, it is output from the cycle counter 262 as the first input to the lead comparator 264; simultaneously that value is routed from the WIDTHLP register 252 as the second input to the lead comparator 264. Thereby, the lead comparator 264 compares the contents of the WIDTHLP register 252 against the cycle counter 262 output and, consequently, outputs a logic level "1" when the count mod WIDTHLP equals zero. That logic level "1" comprises a leading edge candidate pulse.

Thence, the cycle counter 262 counts up with each master clock 45 cycle until it reaches its terminal count, whereupon the cycle counter 262 reloads the contents of the WIDTHLP register 252 and the lead comparator 264 outputs another leading edge candidate pulse, and the process repeats. Except upon the reload of the cycle counter 262 or when extended width is selected, the output of the lead comparator 264 is logic level "0".

The cycle counter block 87 and the trail comparison block 88 together generate trailing edge candidate pulses. When not providing for data pulses of extended width, the trail comparison block 88 compares its two inputs: the count output of the cycle counter 262 and the contents of the TRAILCMP register 250. The output of the trail comparison block 88 is a logic level "0" unless said count and contents match, whereupon the output is a logic level "1" comprising a trailing edge candidate pulse. Although leading edge candidate pulses always occur upon the reload of the cycle counter 262, trailing edge candidate pulses may occur at any count of the cycle counter 262 as determined by the contents of the TRAILCMP register 250.

The cycle counter block 87 establishes the user programmed period by generating a skew delay prior to generating the first leading edge candidate pulse. In generating the skew delay, the select logic 266 selects, for output from the counter multiplexer 260, the input routed from the microprocessor 20. That input is a data instruction that preloads the cycle counter 262 with a value that, if subtracted from the cycle counter's 262 terminal count, equals the number of master clock 45 cycles that comprise the time between the start of the user programmed period and each data pulse, to an accuracy of within one master clock 45 cycle. The generation of that skew delay thus establishes the user programmed period for the candidate pulses because every leading edge candidate pulse is generated upon reloading the cycle counter 262 and because the cycle counter 262 is reloaded such that the number of master clock 45 cycles between reloads equals the number of master clock 45 cycles concatenated to build the user programmable period.

The cycle counter block 87 also disables production of trailing edge candidate pulses whenever user programming provides for data pulses of extended width (i.e., data pulses with duty factors exceeding 100%) in RZ mode and, in so doing, alters the production of leading edge candidate pulses. To provide extended width, both the WIDTHLP register 252 and the DATALP register 254 are used in reloading the cycle counter 262. As when generating data pulses not of extended width, the WIDTHLP register 252 contains a value that when subtracted from the cycle counter's 262 terminal count, plus 1, equals the number of master clock 45 cycles concatenated to build the user programmed period. The DATALP register 254 contains a value that, when subtracted from the cycle counter's 262 terminal count, plus 1, equals the integer number of master clock 45 cycles concatenated in building the plurality of user programmable periods of the extended width data pulse. The select logic 266 selects, in reloading the cycle counter 262, between the two registers 252,254: (i) the input from the DATALP register 254 is selected if the data bit from the RAM chip 42 corresponding to a reload is a logic level "1", or (ii) the input from the WIDTHLP register 252 is selected when both the data bit corresponding to the reload is a logic level "0" and the reload is triggered by the cycle counter 262 reaching terminal count.

For example, assuming that the user programs data pulse widths equal 2.5 times the user programmed period and that the first six data bits are "101000". In that case, the WIDTHLP register 252 contains a value corresponding to the number of master clock 45 cycles in the user programmable period, and the DATALP register 254 contains a value corresponding to the number of master clock 45 cycles in 3 user programmable periods (i.e., the width of the extended pulse in user programmable periods is rounded up to the nearest integer). After an appropriate skew delay is generated and because the first data bit is a logic level "1", the select logic 266 selects for output from the counter multiplexer 260 the input routed from the DATALP register 254, thereby loading the contents of the DATALP register 254 into the cycle counter 262. The contents so loaded are compared by the lead comparator 264 against the contents of the WIDTHLP register 252. Although the contents of the registers 252, 254 are not equal at the most significant bits, the lead comparator is constructed to ignore the most significant bits and, consequently, the lead comparator 264 outputs a leading edge candidate pulse. The cycle counter 262 thereafter counts upon each master clock 45 cycle which count results in an output from the lead comparator 264 of logic level "0" until the number of elapsed master clock 45 cycles equals the number of master clock 45 cycles in the user programmable period. At that event, the lead comparator 264 outputs a second leading edge candidate pulse because the least significant bits will be matched. The cycle counter 262 is not reloaded because the corresponding data bit is a logic level "0".

The cycle counter 262 thereafter continues to count up upon each master clock 45 cycle which count results in an output from the lead comparator 264 of logic level "0" until the number of elapsed master clock 45 cycles again equals the number of master clock 45 cycles in the user programmable period. At that event, the lead comparator 264 outputs a third leading edge candidate pulse and, because the data bit corresponding to the production of the candidate pulse is a logic level "1", the cycle counter 262 reloads. For such reload, the select logic 266 is constructed, as explained above, to select the DATALP register 254 for output from the counter multiplexer 260.

Thereafter, the cycle counter 262 counts up a number of master clock 45 cycles equal to two user programmable periods and the lead comparator produces two additional leading edge candidate pulses corresponding to the next two logic level "0" data bits. Because the cycle counter 262 is not reloaded for logic level "0" data bits, the count thereby arrives within one user programmable period of the terminal count, within which range the trailing edge candidate pulse will be generated by the trail comparison block 88 in the manner explained above. The generation of the trailing edge candidate pulse having no reload effect, the cycle counter 262 continues to count up to its terminal count whereupon the lead comparator 264 produces the leading edge candidate pulse corresponding to the final data bit in the example sequence. Because that last bit is a logic level "0" and the terminal count has been reached, the select logic 266 selects the input from WIDTHLP in reloading the cycle counter 262. Even though the end of the data has been reached, the cycle counter 262 continues to count, resulting in production of both leading and trailing edge candidate pulses that are suppressed by the pattern machine chip 64, as will be explained below. This production of invalid candidate pulses occurs whether the cycle counter block 87 is providing for extended or not extended width data pulses.

Hence, the cycle counter block 87 disables generation of trailing edge candidate pulses by selecting between the WIDTHLP register 252 and the DATALP register 254 in reloading the cycle counter 262 in order to postpone counting into the range at the top of the cycle counter 262 that corresponds to one user programmable period. Generation of leading and trailing edge placement data pulses for extended width output data pulses is explained further below in the discussion of the trail mask pipe block 93.

The leading edge candidate pulses output by the lead comparator 264 are routed, as the first input of the top level block 94, to first flip-flop 270. The trailing edge candidate pulses output by the trail comparison block 88 are routed, as the second input of the top level block 94, to second flip-flop 270. The flip-flops 270,270 are clocked by the master clock 45. The output of second flip-flop 270 is routed to the trail mask pipe block 93. The output of first flip-flop 270 is routed to the RAM address counter block 91, the RAM data latch and shift block 92, and the lead suppress block 95. The flip-flops 268,270 function to resynchronize each candidate pulse to the next master clock 45 cycle, thereby overcoming propagation delays inherent in the generation of the candidate pulses.

Figure 7:
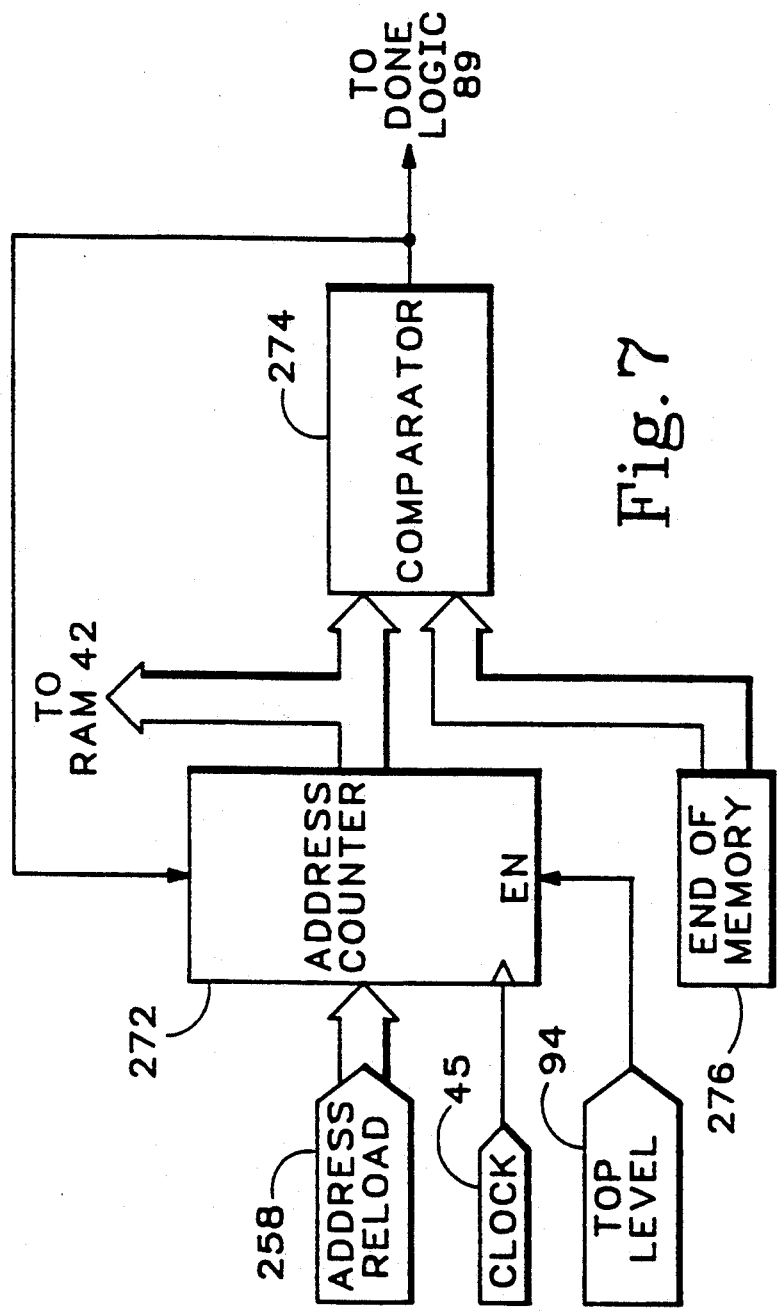
FIG. 7 shows a logic level block diagram of a RAM address counter block incorporated in the pattern machine chip shown in FIG. 6.

The RAM address counter block 91 comprises a first input from first flip-flop 270 of the top level block 94, a second input from the address reload register 258, a clock input from the master clock 45, a first output to the RAM chip 42, and a second output to the done logic block 89. Turning to FIG. 7 for additional structural detail, the RAM address counter block 91 further comprises an address counter 272, a comparator 274 and an end of memory register 276. The address counter 272 is enabled by the occurrence of a leading edge candidate pulse routed from the top level block 94 and, therefore, the counter 272 counts only once per user programmed period. When so enabled, the address counter 274 counts up upon each master clock 45 cycle from the value loaded in from the address reload register 258. Each such count corresponds to an address in the RAM chip 42 and, accordingly, is output from the address counter 274 to address data bits stored by the RAM chip 42. Each such count also is output from the address counter 272 to the comparator 274, where such count is compared to the value that is input to the comparator 274 from the end of memory register 276. When the count matches the value from the end of memory register 276, the comparator 274 outputs a logic level "1" which is routed (i) to the address counter 272 to trigger a reload from address reload register 258, and (ii) as the output of the RAM address counter block 91 to the done logic block 89.

The values stored by the address reload register 258 are provided by the microprocessor 20 and correspond to the user programmed trajectory through the data bits stored in the RAM chip 42. In the preferred embodiment, at least two values are stored in the address reload register 258: the first value identifies the address of the first data bit and the second value identifies the address to which the RAM address counter block 91 will point after having addressed all data from the first data bit to the end of memory data bit for looping purposes. The end of memory register 276 is preferably set to the top address of the RAM chip 42.

Generally, the RAM address counter block 91 sequences through the addresses of the data bits stored in the RAM chip 42 according to the user programmed trajectory and sets a flag bit to signal for output the done logic block 89.

Referring again to FIGS. 6A and 6B, the RAM data latch and shift block 92 comprises a first input from first flip-flop 270 of the top level block 94, a second input from the RAM chip 42, a clock input from master clock 45, a first output to the lead suppress block 95 and a second output to the trail mask pipe block 93. The RAM data latch and shift block is enabled by the occurrence of a leading edge candidate pulse routed from first flip-flop 270 of the top level block 94 and, therefore, the block 92 fetches one bit of data only once per user programmed period on the occurrence of a master clock 45 cycle. The fetched data bit is routed as the output of the block 92 to both the lead suppress block 95 and to the trail mask pipe block 93 in determining, as will be further explained below, which candidate pulses are suppressed by such blocks 95,93.

The done logic block 89 has an input from the RAM address counter block 91, a first output to the lead suppress block 95 and a second output to the trail mask pipe block 93. The done logic block 89 synchronizes (i) the flag bit generated by the comparator 274 of the RAM address counter block 91, upon reaching the address corresponding to the top of memory, to (ii) the data bit fetched by the RAM data latch and shift block 92 at the top of memory address. The done logic block 89 resynchronizes the flag bit by overcoming the cumulative propagation delays arising between the addressing of data and the availability of the fetched data. The done logic block 89 is used only when the data generation test unit 18 is in burst mode, because only in that mode does the top of memory indicate the last valid data. In other modes of operation, the done logic block 89 outputs the resynchronized flag bit to both the lead suppress block 95 and to the trail mask pipe block 93, but the data fetched after the top of memory in such modes remains valid and is not to be suppressed.

The lead suppress block 95 comprises a first input from first flip-flop 270 of the top level block 94, a second input from the done logic block 89, a third input from the RAM data latch and shift block 92, and an output comprising the ungated leading edge placement data 54. The lead suppress block 95 suppresses leading edge candidate pulses as shown by the truth table, Table 1 herein.

TABLE 1

| Done | Data | Lead Candidate | Output |
|------|------|----------------|--------|
| 1 | X | X | 0 |
| 0 | X | 0 | 0 |
| 0 | 0 | 1 | 0 |
| 0 | 1 | 1 | 1 |

As shown by the table, the output leading edge placement data is a logic level "1" only when, contemporaneously, the data bit is a logic level "1", a leading edge candidate pulse is generated and the done bit is not set.

The trail mask pipe block 93 comprises a first input from second flip-flop 268 of the top level block 94, a second input from the done logic block 89, a third input from the RAM data latch and shift block 92, a fourth input from the MASKCON register 256, a fifth input from the microprocessor 20 and an output that is routed to the output flip-flop 96 and to the output multiplexer 97. The MASKCON register 256 provides two control bits to the trail mask pipe block 93, which bits are calculated by the microprocessor 20 to inform the trail mask pipe block 93 to suppress an invalid trailing edge candidate pulse generated as a result of an indeterminate condition between the cycle counter block 87 and the trail comparison block 88 in producing extended width data pulses. The indeterminate condition occurs when the value loaded into the trail comparison block 88 from the TRAILCMP register 250 is the same as the value loaded into the cycle counter 262 from the WIDTHLP register 252.

Figure 8:
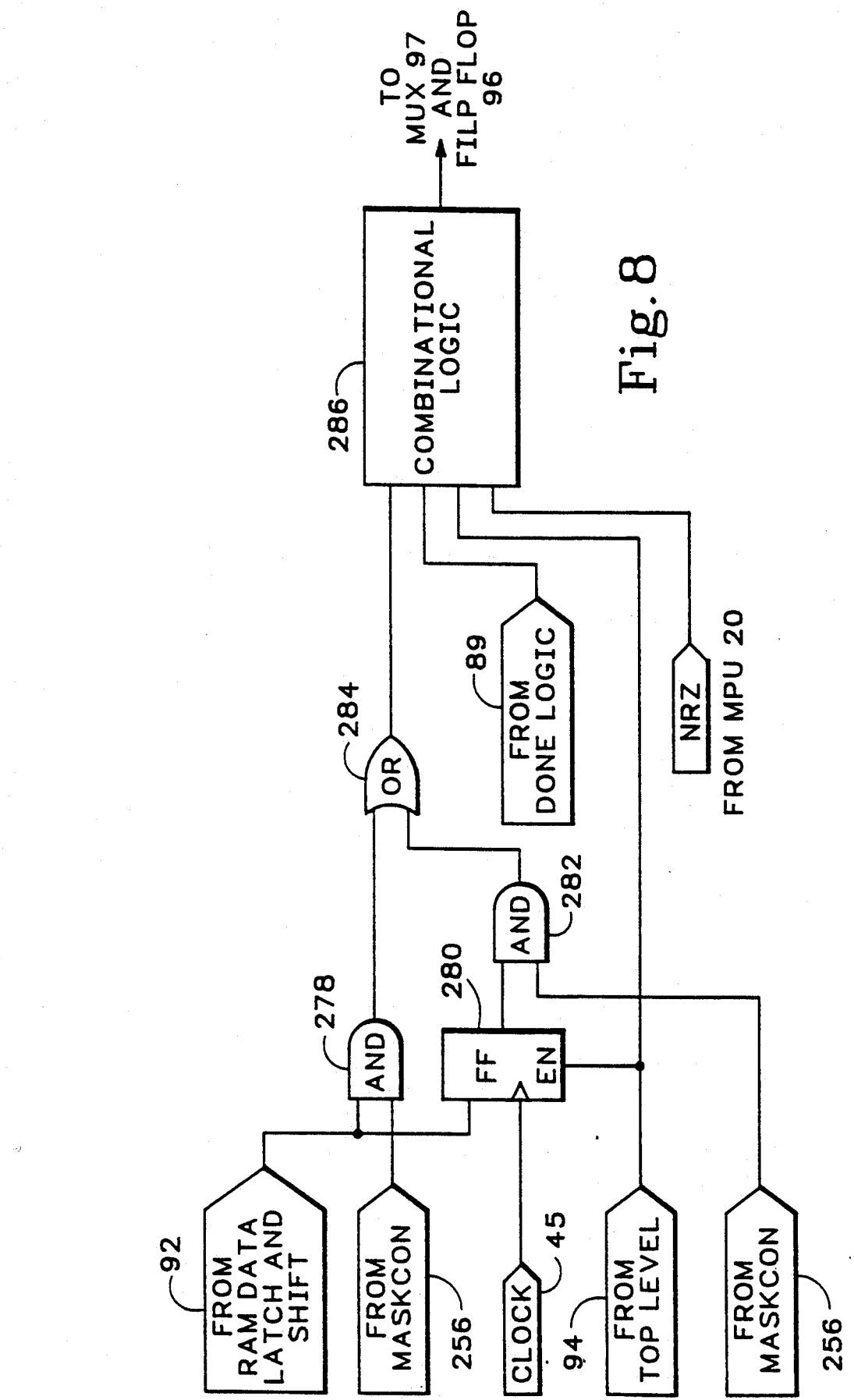
FIG. 8 shows a logic level block diagram of a trail mask pipe block incorporated in the pattern machine chip shown in FIG. 6.

Turning to FIG. 8 for additional structural detail, the trail mask pipe block 93 further comprises a first AND gate 278, a flip-flop 280, a second AND gate 282, an OR gate 284, and a combinational logic block 286. First AND gate 278 gates the data bit input from the RAM data latch and shift block 92 with an input of one bit from the MASKCON register 256, outputting that logic combination as one input to the OR gate 284. Flip-flop 280 comprises a clock input from the master clock 45 input, an enable input from the top level block 94 (i.e., trailing edge candidate pulses enable the flip-flop 280), an input from the RAM data shift and latch block 92, and an output that is routed to second AND gate 282. Second AND gate 282 gates the input from the flip-flop 280 with an input of one bit from the MASKCON register 256, outputting that logic combination as the second input to the OR gate 284. The OR gate logically or's its two above-identified inputs, outputting that logic combination as a first input to the combinational logic block 286. The combinational logic block 286 comprises a second input from the done logic block 89, a third input from the top level block 94 comprising trailing edge candidate pulses, a fourth input from the microprocessor 20 comprising the NRZ control bit, and the output of the trail mask pipe block 93.

In operation, the trail mask pipe block 93 suppresses generation of trailing edge candidate pulses in order, for example, to extend the width of the data pulses to greater than 100% duty factor or to prevent the output of trailing edge candidate pulses after the RAM chip 42 data is exhausted. The trail mask pipe block 93 suppresses trailing edge candidate pulses as shown by the truth table, Table 2 herein.

TABLE 2

| Done | NRZ | Trail Candidate | OR Gate | Output |
|------|-----|-----------------|---------|--------|
| 0 | 1 | 0 | X | 0 |
| 0 | 1 | 1 | X | 1 |
| 1 | 1 | X | X | 0 |
| X | 0 | 0 | X | 0 |
| X | 0 | X | 1 | 0 |
| X | 0 | 1 | 0 | 1 |

As shown by Table 2, the input from the done logic block 89 suppresses trailing edge candidate pulses only when in NRZ mode; that input cannot suppress trailing edge candidate pulses when extended width data pulses are being generated because the trailing edge of an extended width pulse may need to be generated after addressing the last data bit from RAM chip 42.

Referring again to FIGS. 6A and 6B, the trailing edge candidate pulses that are output by the trail mask pipe 93 both are routed indirectly to the output multiplexer 97 through the output flip-flop 96 clocked by the master clock 45, and are routed directly to the output multiplexer 97. The candidate pulses routed to the output flip-flop 96 are delayed one additional master clock 45 cycle; the candidate pulses that are routed directly obtain no such additional delay. The select input of the output multiplexer 97 is routed from the late trail register 263, a one bit register that is loaded by the microprocessor 20. Thus, the output multiplexer 97, in conjunction with the output flip-flop 96 and the late trail register 263, provides for outputting the trailing edge candidate pulse either with or without the delay of one additional master clock 45 period. As is further explained below with reference to FIG. 10, outputting trailing edge candidate pulses with such delay overcomes the limitation of the precision timing block to provide, at most, one master clock delay to trailing edge placement data.

The preferred embodiment of the pattern machine chip 64, as explained above, produces one bit of leading edge placement data and one bit of trailing edge placement data per master clock 45 cycle. However, practical conditions, such as maximum gate array clock rates, may necessitate implementation of the pattern machine chip 64 in, for example, a 4-bit per clock architecture clocked by a slave clock 47 operating at one quarter the master clock 45 rate. In such an architecture, modifications to the circuitry described above, as well as additional circuitry, must be introduced. In FIGS. 6A and 6B, a 4-bit architecture necessitates the addition of a pattern select block 90 with inputs from a PATS register 260 and from the cycle counter 262 and outputs to the RAM data latch and shift block 92, and the trail mask pipe block 93. The pattern select block 90 determines the pattern of leading and trailing edge placement data for the output nibbles generated in each slave clock cycle based on whether the first valid nibbles are being used. The PATS register 260 provides the pattern select block 90 with a pipeline of nibble data such that, for each bit within a nibble, a logic level "1" enables that bit and a logic level "0" disables that bit. The PATS register 260 provides 16 bits, allocated as follows:

| | |
|---|---|
| D0-D3: | first leading edge placement data nibble; |
| D4-D7: | subsequent leading edge placement data nibble; |
| D8-D11: | first trailing edge placement data nibble; |
| D12-D15: | subsequent trailing edge placement data nibble. | nibble.

In addition to the pattern select block 90 and the PATS register 260, the 4-bit architecture necessitates other changes in the 1-bit pattern machine chip 64. For example, the WIDTHLP register 252 holds values geared not to the master clock 45 period, but rather to the slave clock 47 period, and the cycle counter block 87 concurrently generates a leading edge candidate pulse for each of the four bits. The RAM data latch and shift block 92 continues to fetch data in 8 bit patterns, but outputs such data in two nibbles of four bits each on each slave clock 47 cycle. The trail mask pipe 93 and the lead suppress block 95 suppress candidate pulses concurrently for each of their four bits. For the trail mask pipe 93, the input from the MASKCON register 256 must increase from 2 bits to 8 bits to account for the shift from a 1-bit to a 4-bit architecture. The 8 bits can assume any of the configurations set forth in the following table, Table 3 herein.

TABLE 3

| Control Byte | Width (in Master Clock Cycles) |
|---|---|
| 00000000 | 0 |
| 00000001 | 1 |
| 00000011 | 2 |
| 00000111 | 3 |
| 00001111 | 4 |
| 00011111 | 5 |
| 00111111 | 6 |
| 01111111 | 7 |
| Use the row # 4 + Width mod 4 | 8+ |

Generally, throughout the data signal, the timing of data pulses is invariate: all data pulses are created, if at all, from leading edge placement data pulses and trailing edge placement data pulses that are generated according to user programmed timing and formatting instructions applicable throughout the data signal. The rising edges of the edge placement pulses, for each of the leading and trailing edge, control the edge placement references for the data pulses in the data signal.

Figure 9:
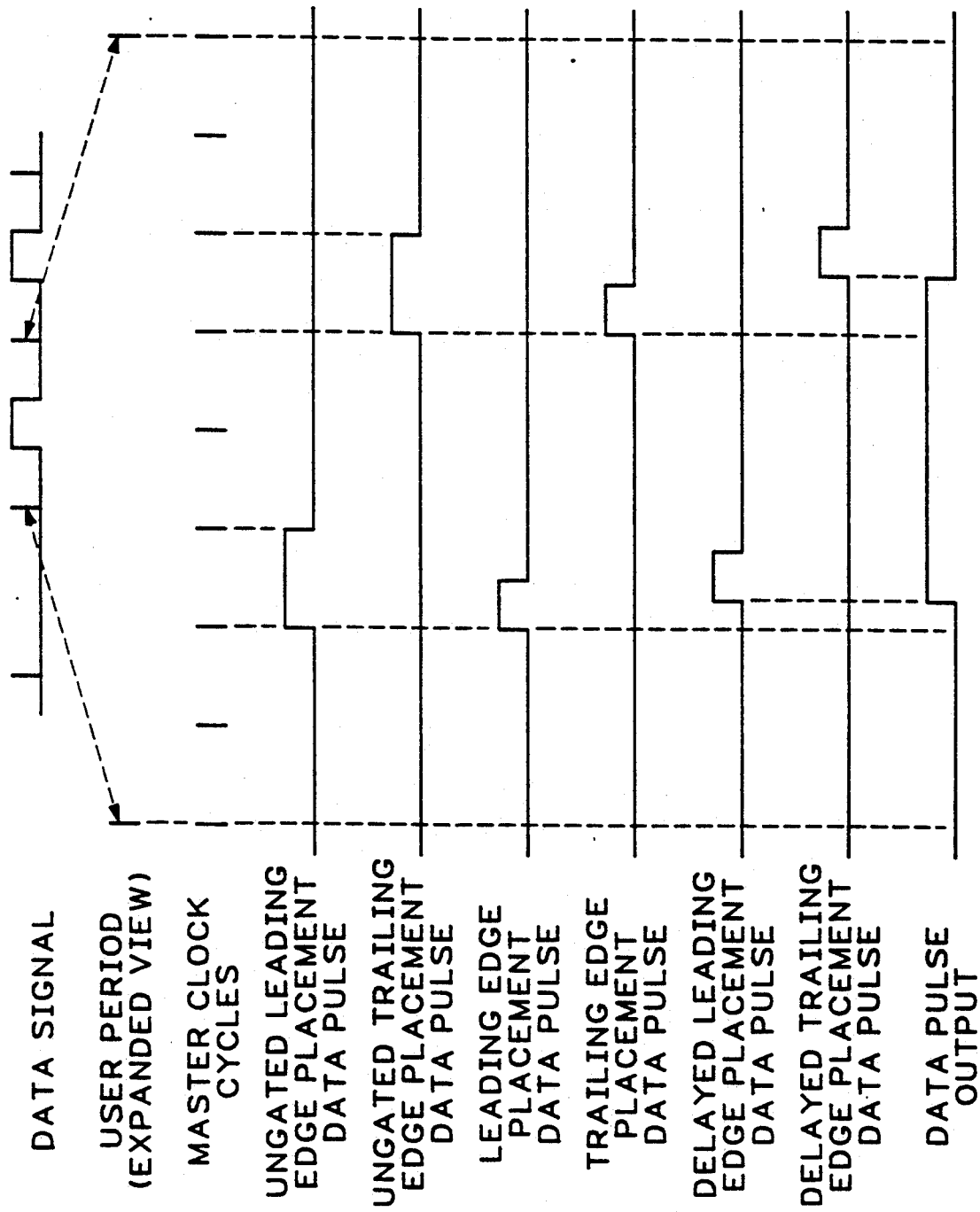
FIG. 9 shows a timing diagram illustrating generally the generation of a data pulse.

Referring to FIG. 9, the generation of a data pulse is illustrated generally by timing diagram. Three user programmed periods of a data signal are shown comprising a data stream of logic levels "011" In expanding the view of the user programmed period corresponding to the first data pulse expanded, the user programmed period is shown to be constructed of eight concatenated master clock cycles. The first data pulse is produced as follows: the parallel to serial converter 46 of the formatting block 32 generates the ungated leading and trailing edge placement data pulses, each coarsely timed within the user programmed period to within one master clock cycle; the gating clock 62 produced from the master clock 45 by the converter 46 gates the ungated leading and trailing edge placement data pulses at, respectively, logic AND gates 50,52 of the formatting block 32, producing the leading and trailing edge placement data pulses by shortening the duration of the ungated pulses; the leading and trailing edge placement data pulses are then delayed to a precise accuracy by, respectively, leading edge delay block 68 and trailing edge delay block 70 to produce the delayed leading and trailing edge placement data pulses; these delayed edge placement data pulses are then routed to the programmable dominance RS flip-flop 80 of the precision timing block 38 for construction of the data pulse for output.

Figure 10:
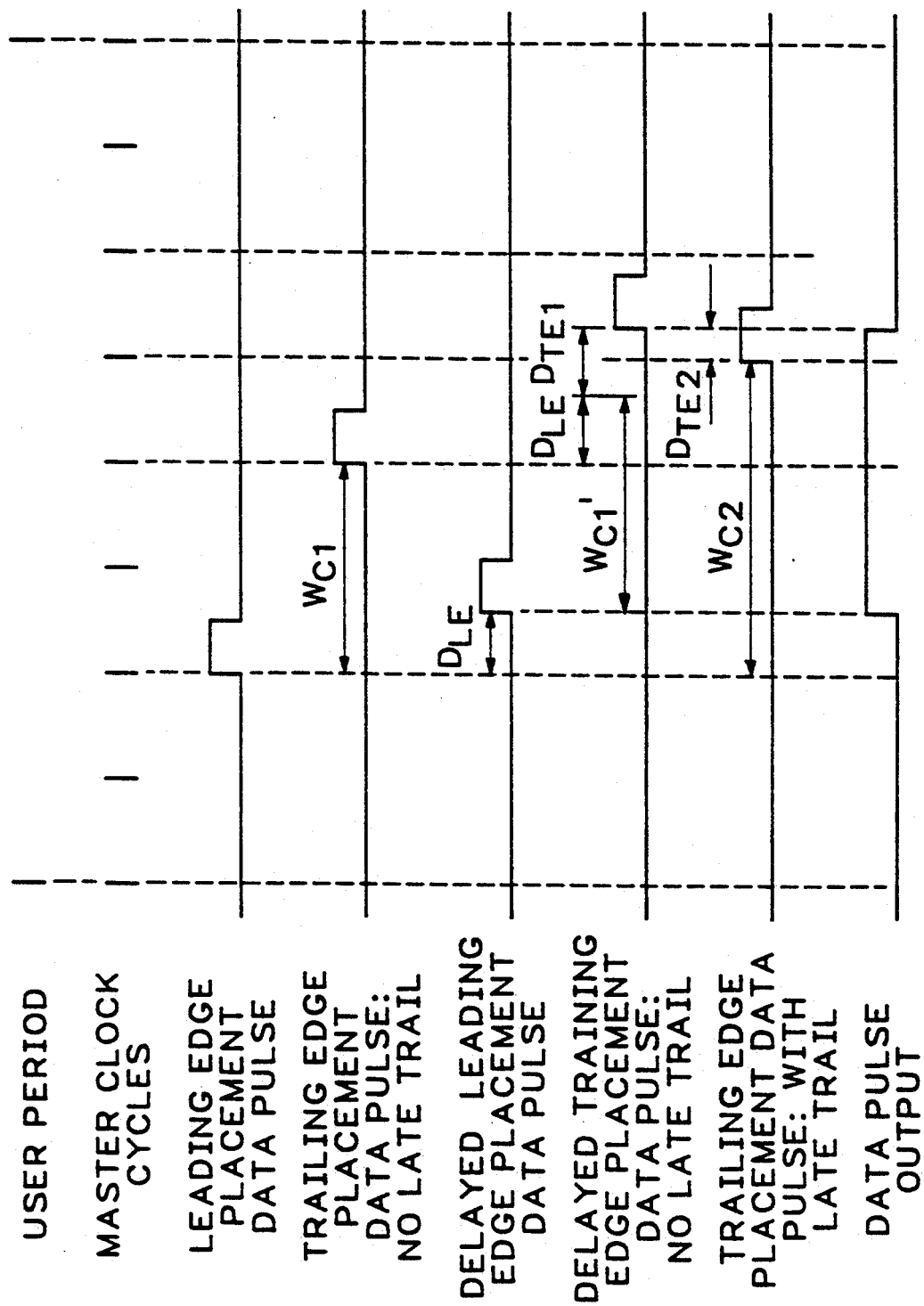
FIG. 10 shows a timing diagram illustrating the application of various delays in providing data pulse timing.

Referring to FIG. 10, the generation of a data pulse is illustrated by timing diagram with reference to the late trail operation of the pattern machine chip 64. The late trail operation, as effected by the output multiplexer 97 in conjunction with the output flip-flop 96 and the late trail register 262, disables the pattern machine chip's 64 output of trailing edge placement data pulses for one master clock 45 cycle whenever the sum of (i) the delay to be applied by the precision timing block 38 to the leading edge placement data pulse and (ii) the delay to be applied by that block 38 to the trailing edge placement data pulse would exceed one master clock period. As illustrated, if the late trail operation is assumed to be disabled, the formatting block 32 would generate a leading edge placement data pulse and a trailing edge placement data pulse, the two separated by a width W(cl) that is placed coarsely by master clock cycles. With such pulses, the precision timing block 38 would delay the leading edge placement data pulse by some delay D(le). The precision timing block 38 would attempt to delay the trailing edge placement data pulse by a delay equal to the sum of D(tel) and D(le), the D(le) being added in order to maintain the width W(cl) of the data pulse. However, as it was assumed that the sum of D(tel) and D(le) exceeds one master clock cycle, the precision timing block 38 would be unable to fully delay the trailing edge placement data pulse as that block's range of delay is limited to one master clock cycle. To overcome this limitation, the late trail register's 262 bit is set to select the trailing edge candidate pulse that is delayed by the output flip-flop 96, thereby correcting for the excess delay by extending the coarse width one master clock cycle from W(cl) to W(c2) and by reducing to D(te2) the delay to be applied by the precision timing block 38 to the trailing edge placement data pulse.

Figure 11:
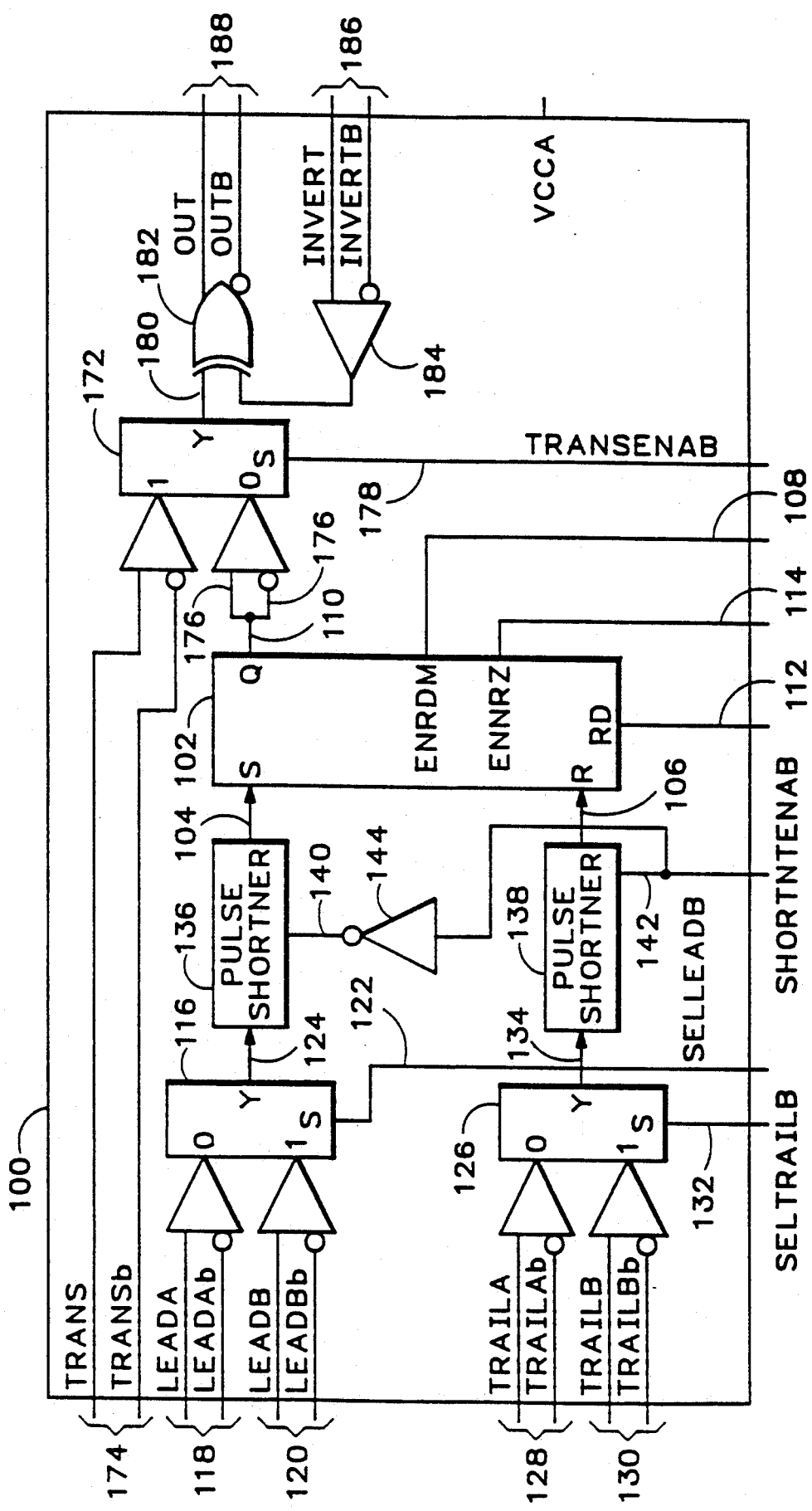
FIG. 11 shows a logic diagram for a programmable dominance RS flip-flop circuit which can behave like a D-latch and is incorporated in the precision timing block of FIG. 3 according to the present invention.

Turning now to FIG. 11, the programmable dominance RS flip-flop/transparent latch 80 shown in FIG. 4 is preferably embodied in an integrated circuit, as shown in greater detail by the logic diagram 100. At the heart of that integrated circuit is an RS/latch cell 102, which has a set input 104, a reset input 106, an R dominance enable input 108 (designated "EnRDM"), an output 110 (designated "Q"), a direct reset input 112 (designated "RD") and an NRZ ("nonreturn to zero") enable input 114 (designated "EnNRZ"). The default mode of the RS/latch cell is RZ (return to zero). In that mode, the cell behaves like an RS flip-flop, except that it can be programmed for set or reset dominance so that when a logic level "1" is present both at the set input 104 and the reset input 106, either the set input or the reset input prevails; no indeterminant condition occurs under those circumstances. Reset dominance is selected by the application of a logic level "1" to the R dominance enable input 108; otherwise, set dominance prevails. The specific operation of the RS/latch is shown by the truth table, Table 4 herein.

TABLE 4

| S | R | rdom | Q |
|---|---|------|---|
| 0 | 0 | 0 | Qn-1 |
| 1 | 0 | 0 | 1 |
| 0 | 1 | 0 | 0 |
| 1 | 1 | 0 | 1 |
| 0 | 0 | 1 | Qn-1 |
| 1 | 0 | 1 | 0 |
| 0 | 1 | 1 | 1 |
| 1 | 1 | 1 | 1 |

The RS/latch may also be operated in an NRZ mode. This is selected by the application of a logic level "1" to the NRZ enable input 114. In the NRZ mode, the RS/latch behaves like a D-type latch, with the S input 104 serving as a D input and R is the transparent enable input. In that case, the output 110 simply tracks the logic level applied to the S input 104 when R is at logic level "1", and holds its prior state when R is at logic level "0".

The RS/latch may be directly reset by application of a logic level "1" to the direct reset input 112. This is ordinarily used for initialization of the circuit at system turn on. The RS/latch is explained below in greater detail, with respect to FIG. 13.

In addition to the RS/latch, the integrated circuit represented by logic diagram 100 includes some input circuitry preceding the set input 104 and the reset input 106, and some output circuitry following the output 110. The input circuitry comprises a first multiplexer 116, having a first differential logic input 118 (designated "leadA" and "leadAb"), a second differential logic input 120 (designated "leadB" and "leadBb"), a select input 122 (designated "selLeadB") and an output 124 (designated "Y"). Inputs 118 and 120 comprise the set input 121 in FIG. 4. It further comprises a second multiplexer 126, having a third differential logic input 128 (designated "trailA" and "trailAb"), a fourth differential logic input 130 (designated "trailB" and "trailBb"), a select input 132 (designated "selTrailB") and an output 134 (designated "Y"). Inputs 128 and 130 comprise the reset input 133 in FIG. 4. Ordinarily, multiplexer 116 receives its input from logic input 118; however, when a logic level "1" is presented to the select input 122, multiplexer 116 receives its input from logic input 120. Likewise, multiplexer 126 ordinarily receives its input from logic input 128, but switches to logic input 130 when a logic level "1" is applied to select input 132. The design of such multiplexer and input selection circuitry is commonly understood by a person of ordinary skill in the art.

The output 124 of multiplexer 116 is applied to a pulse shortener circuit 136, having a respective output applied to the S input 104 of RS/latch cell 102. The output 134 of multiplexer 126 is applied to a pulse shortener circuit 138, having a respective output applied to the R input 106 of the RS/latch cell 102. Pulse shortener 136 has an enable input 140, and pulse shortener 138 has an enable input 142. An inverter 144 is connected between enable input 140 and enable input 142. Thence, one pulse shortener or the other is enabled, a logic level "0" applied to enable input 142 causing pulse shortener 136 to be enabled while pulse shortener 140 is not enabled, and a logic level "1" applied to enable input 142 causing pulse shortener 138 to be enabled while pulse shortener 136 is not. As their names imply, the pulse shortener circuits reduce the width of the pulse applied to their input a predetermined amount, preferably by about 200 picoseconds in the system of the present invention, for a reason that will be explained below.

Figure 12:
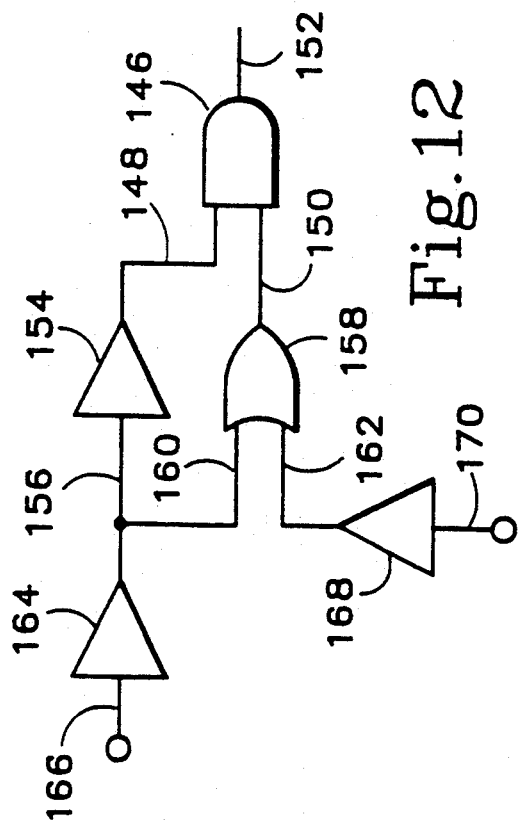
FIG. 12 shows a logic diagram for a pulse shortener circuit employed in the programmable dominance RS flip-flop circuit of FIG. 11.

A suitable design for the pulse shortener circuit 136 and the pulse shortener circuit 138 is shown in FIG. 12. It comprises an AND gate 146, having two inputs 148 and 150 and an output 152; a delay gate 154, having an output connected to the input 148 of the AND gate and an input 156; and a zero delay OR gate 158 (in practice the functions of AND gate 146 and OR gate 158 are performed by the same circuit), having an output connected to input 150 of the AND gate, a first input 160 tied to input 156 of amplifier 154 and a second input 162. Inputs 156 and 160 are fed by the output of a buffer 164, which receives a multiplexer output at input 166. Input 162 to the OR gate 158 receives the output from a buffer 168 which receives the enabling signal input at 170.

In operation, a pulse applied at input 166 propagates through amplifier 164 and amplifier 154 to input 148 of AND gate 146. If there is an enable signal applied to input 170, that signal propagates through amplifier 168 and OR gate 158 and is applied to input 150 of the AND gate 146, so that a pulse applied at input 148 appears unshortened at output 152. On the other hand, if the pulse shortener is not enabled, the pulse to be shortened, which is also applied to input 150 through the zero delay OR gate 158, will propagate through the AND gate 146 for a shorter period of time because its trailing portion is cut off by the termination of the pulse propagating through the OR gate 158.

The output circuitry of the integrated circuit comprises a third multiplexer 172, having a fifth differential logic input 174 (designated "trans" and "transb"), a differential input 176 connected to the output 110 of the RS/latch cell 102, a transducer enable input 178 (designated "transEnab"), and an output 180 (designated "Y"). This permits the integrated circuit to select as its output either the output from the RS/latch cell 102 or a differential logic signal input 174, which passes straight through the integrated circuit. The input 174 is selected when a logic level "1" is applied to transducer enable input 178.

The output 180 of multiplexer 172 is applied to an EXCLUSIVE OR ("XOR") gate 182, along with the output from a buffer 184, having a differential logic input 186 (designated "invert" and "invert b"). A differential output 188 from the XOR gate 182 provides the output from the integrated circuit. With a logic level "0" applied to the "invert" lead of input 186, the output 188 directly reflects the logic level at output 180 of multiplexer 172. With a logic level "1" applied to the invert lead of input 186, the output 188 reflects the inverse of the logic level produced at output 180 of the multiplexer 172. Thence, the input 186 can be employed to change a NRZ signal to its complement, and to change an RZ signal to an R1 signal. Changing from RZ to R1 also requires the RAM chip 42 data to be inverted by the microprocessor 20.

Figure 13:
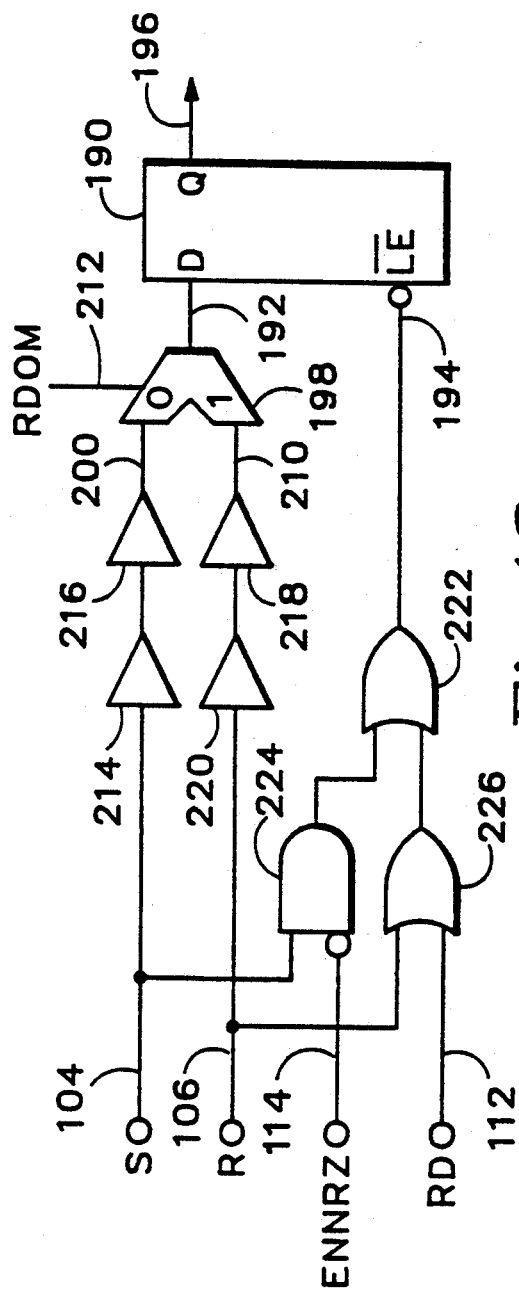
FIG. 13 shows a logic diagram for an RS/latch cell employed in the circuit of FIG. 11 according to the present invention.

Turning now to FIG. 13, the RS/latch cell 102 is shown in greater detail. The principal portion of the RS/latch cell 102 is a D-type latch 190 having a D input 192, a latch enable input 194 (designated "$\overline{LE}$") and an output 196 (designated "Q"); and a multiplexer 198, having an output connected to input 192 of the D-type latch 190, a first input 200, a second input 210 and a dominance input 212 (designated "rdom"). The S input 104 is tied through a pair of delay gates 214 and 216 to input 200 of multiplexer 198 and the R input 106 is tied through a pair of delay gates 218 and 220 to input 210 of the multiplexer. When a logical "zero" is present at R dominance input 212, the multiplexer selects the signal on the S input 104 for application to the D input 192 of the D-type latch 190. When a logic level "1" is applied to the input 212, R dominance is selected and the signal on the R input 106 is passed through the multiplexer to the D input 192 of the D-type latch 190.

To cause the circuit to behave like an RS/flip-flop, the set input 104 and the reset input 106 are also passed through an OR gate 222 to the latch enable input 194 of the D-type latch 190. The set input is applied to the OR gate 222 through an AND gate 224 having as its inputs set input 104 and the NRZ enable input 114 of the RS/latch cell 102. The reset input 106 is supplied through another OR gate 226 to the input of OR gate 222. The direct reset input 112 is also applied through OR gate 226 to OR gate 222. Delay gates 214, 216, 220 and 218 are provided to compensate for the propagation delay introduced by AND gate 224, OR gate 226 and OR gate 222.

Thence, in a RZ mode, and in set dominance, a logic level "1" on the set input 104, in the presence of a logic level "0" on the reset input 106, will appear on the D input 192 and the latch enable input 194 of the D-type latch 190, thereby producing a logic level "1" at output 196. A "0" on the set input and a "1" on the reset input will produce a "0" at the output. A "1" on the set input and a "1" on the reset input will produce a "1" on the output. Thus, there is no indeterminant state when a "1" is applied to both the set input and to the reset input.

Where a logic level "1" is applied to the dominance input 212 of the multiplexer 198, a similar result occurs, except that the output tracks the reset input. When a logic level "1" is applied to the NRZ enable input 114, the circuit simply behaves like a D-type latch, the set input 104 corresponding to the D input. A logic level "1" can be applied to the direct reset input 112 to initialize the output at "0".

The programmable RS flip-flop/transparent latch is now explained in the context of the overall system of the present invention. The leading edge delay block 68 and the trailing edge delay block 70 both provide a direct output path and an output paths wherein the pulse is delayed about 1.8 nanoseconds. Multiplexers 116 and 126 in the integrated circuit represented by logic diagram 100 are used to select between those two output paths for the respective precision delay controls. The function of the pulse shorteners is to allow 50 percent duty factor inputs from the precision delay controls to reliably produce 50 percent duty factor outputs. Ideally, for a 50 percent duty factor, both the lead and trail pulse trains are each 50 percent of the period but the trail pulse lags the lead pulse by 180 degrees. The falling edge of the trail occurs coincidentally with the rising edge of the lead, which presents no problem.

In reality, the lead and trail pulse trains may not be exactly 50 percent duty factor. For example, suppose that the pulses are 100 picoseconds longer than 50 percent. The rising edge of the trail will then occur 100 picoseconds before the falling edge of the lead. With reset dominance, the rising edge of the output pulse will not occur until the trail goes low. Thence, where set dominance has been selected, it is necessary to shorten the set pulse. Where reset dominance has been selected, it is necessary to shorten the reset pulse. Since there is no indeterminant state produced by the RS/latch cell 102 when both the set and the reset are at logic level "1", a duty factor from 0 to in excess of 100 percent may be produced in the output pulse.

The transducer input 174 may be selected, rather than the output 110 of the RS/latch cell, to pass an external signal through the integrated circuit. R1 or complementary NRZ may be selected for the output signal by application of a logic level "1" to the invert input 186 and providing appropriate RAM chip 42 data.

The terms and expressions which have been employed in the foregoing specification are employed therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A data time generator system, comprising:
   (a) pattern generation means, responsive to a data pulse input signal and to pattern instructions, for producing a coarse lead pulse representative of the time of occurrence of the leading edge of an output pulse and a coarse trail pulse representative of the time of occurrence of the trailing edge of said output pulse, said coarse trail pulse being adjustable independent of said coarse lead pulse; and
   (b) output generation means, responsive to said coarse lead pulse and said coarse trail pulse, for producing said output pulse with a leading edge having a time of occurrence determined by said coarse lead pulse and a trailing edge having a time of occurrence determined by said coarse trail pulse.

2. The system of claim 1, wherein said pattern generation means includes instruction register means for receiving and storing said pattern instructions.

3. The system of claim 1, wherein said pattern generation means includes:
   (i) cycle counter means for establishing an output pulse period;
   (ii) lead logic means for producing a coarse lead pulse candidate in response to an input data pulse within a first predetermined period of time following the beginning of said output pulse period; and
   (iii) trail logic means for producing a coarse trail pulse candidate in response to an input data pulse within a second predetermined period of time following the beginning of said output pulse period.

4. The system of claim 3, wherein said cycle counter means produces a current count, said lead logic means comprises lead comparator means for comparing said current count to a lead pulse value and producing a coarse lead pulse candidate when they are equal, and said trail logic means comprises trail comparator means for comparing said current count to a trail pulse value and producing a coarse trail pulse candidate when they are equal.

5. The system of claim 4, further comprising lead suppression means for suppressing said coarse lead pulse and trail suppression means for suppressing said coarse trail pulse, both in response to said pattern instructions.

6. The system of claim 5, wherein said output generation means includes:
   (i) lead precision delay control means, responsive to said coarse lead pulse and said pattern instructions, for adjusting the timing of said coarse lead pulse to produce a fine lead pulse representative of the time of occurrence of the leading edge of said output pulse; and
   (ii) trail precision delay control means, responsive to said coarse trail pulse and said pattern instructions, for adjusting the timing of said coarse trail pulse to produce a fine trail pulse representative of the time of occurrence of the trailing edge of said output pulse.

7. The system of claim 6, wherein said output generation means further includes programmable dominance RS flip-flop means, responsive to said fine lead pulse and said fine trail pulse, for initiating said output pulse in response to said fine lead pulse and terminating said output pulse in response to said fine trail pulse, said flip-flop being programmed so that the most recently occurring of said fine lead pulse and said fine trail pulse governs whether said output pulse is initiated or terminated.

8. The system of claim 1, further comprising random access memory means, connected to said pattern generation means, for producing said data pulse input signal, said data pulse input signal comprising a plurality of sequentially ordered data values.

9. The system of claim 1, wherein said output generation means includes:
   (i) lead precision delay control means, responsive to said coarse lead pulse and said pattern instructions, for adjusting the timing of said coarse lead pulse to produce a fine lead pulse representative of the time of occurrence of the leading edge of said output pulse; and
   (ii) trail precision delay control means, responsive to said coarse trail pulse and said pattern instructions, for adjusting the timing of said coarse trail pulse to produce a fine trail pulse representative of the time of occurrence of the trailing edge of said output pulse.

10. The system of claim 9, wherein said output generation means further includes programmable dominance RS flip-flop means, responsive to said fine lead pulse and said fine trail pulse, for initiating said output pulse in response to said fine lead pulse and terminating said output pulse in response to said fine trail pulse, said flip-flop means being programmed so that the most recently occurring of said fine lead pulse and said fine trail pulse governs whether said output pulse is initiated or terminated.

11. The system of claim 10, wherein said programmable dominance RS flip-flop means comprises a logic device which can function as a set-reset flip-flop and which can be programmed for either set or reset dominance, said logic device comprising:
   (iii) D-type latch means, having a D input selectively responsive to said fine lead pulse or said fine trail pulse, an enable input and an output, for providing at said output a logic level identical to the logic level applied to said D input when said enable input is "1" and maintaining the current logic level at said output when said enable input is "0"; and
   (iv) multiplexer means, having a set input responsive to said fine lead pulse, a reset input responsive to said fine trail pulse, a dominance input and an output connected to said D input of said D-type latch means, for selectively passing to said D input either the logic level at said set input or the logic level at said reset input, depending on the logic level applied to said dominance input.

12. The logic device of claim 11, further comprising latch enable control means, having a set input, a reset input and an output connected to said enable input of said D-type latch, for causing said enable input to go to a logic level "1" whenever a logic level one is applied to either said set input or said reset input.

13. The logic device of claim 12, further comprising NRZ enable control means, having a set input, an NRZ enable input and an output connected to said set input of said latch enable control means, for causing said latch enable control means to remain at a logic level "0" unless the logic levels applied to both said NRZ enable input and said set input of said NRZ enable control means are "1".

14. The logic device of claim 12, further comprising direct reset control means, having a direct reset input, a reset input and an output, for producing a logic level "1" at said reset input of said latch enable control means whenever a logic level "1" is presented at either said reset input or said direct reset input of said direct reset control means.

* * * * *